United States Patent
Kitada et al.

(10) Patent No.: US 7,670,925 B2
(45) Date of Patent: Mar. 2, 2010

(54) SEMICONDUCTOR DEVICE, METHOD OF MANUFACTURING SAME, AND APPARATUS FOR DESIGNING SAME

(75) Inventors: Hideki Kitada, Kawasaki (JP); Takahiro Kimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 16 days.

(21) Appl. No.: 11/957,706

(22) Filed: Dec. 17, 2007

(65) Prior Publication Data

US 2008/0150586 A1    Jun. 26, 2008

(30) Foreign Application Priority Data

Dec. 20, 2006    (JP)  ............... 2006-343094

(51) Int. Cl.
     *H01L 21/00*    (2006.01)

(52) U.S. Cl. ............... 438/427; 438/435; 438/620; 438/633; 438/672; 438/699; 257/E21.232; 257/E21.444

(58) Field of Classification Search ............... 438/427, 438/435, 620, 633, 672, 692, 699; 257/E21.232, 257/E21.444

See application file for complete search history.

(56) References Cited

U.S. PATENT DOCUMENTS

| 5,292,689 A | * | 3/1994 | Cronin et al. ............... 438/435 |
| 2006/0035455 A1 | * | 2/2006 | Lo et al. ..................... 438/620 |

FOREIGN PATENT DOCUMENTS

| JP | 04326411 A | 11/1992 |
| JP | 08272480 A | 10/1996 |

\* cited by examiner

*Primary Examiner*—Michael S Lebentritt
(74) *Attorney, Agent, or Firm*—Westerman, Hattori, Daniels & Adrian, LLP

(57) ABSTRACT

A semiconductor device is disclosed that includes multiple logic circuit cells having respective logic circuits formed therein; and multiple interconnects connected to the corresponding logic circuit cells. At least one of the interconnects has an opening formed therein so as to have an opening ratio different from one or more of the opening ratios of the remaining interconnects.

4 Claims, 19 Drawing Sheets

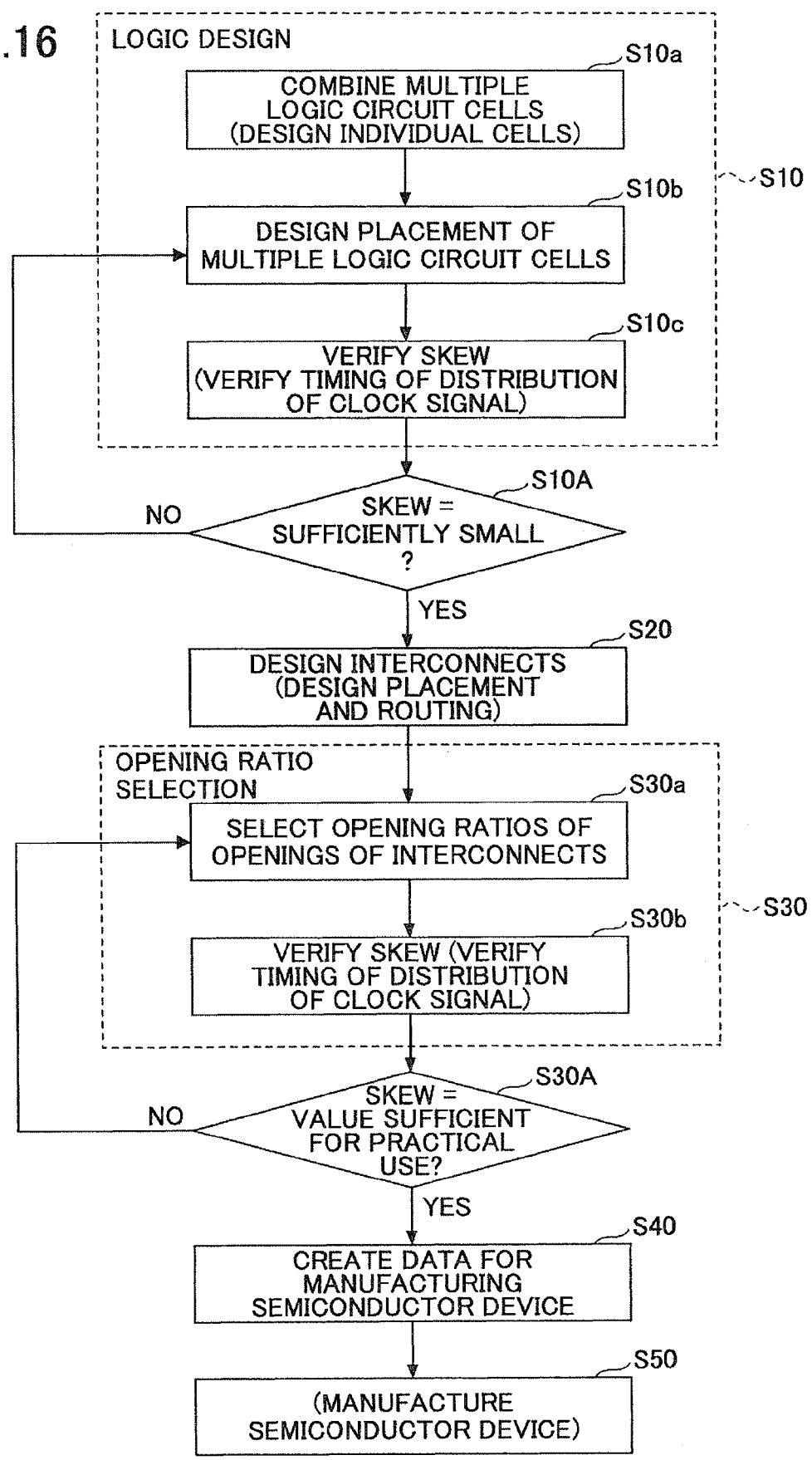

SEMICONDUCTOR DEVICE, METHOD OF MANUFACTURING SAME, AND APPARATUS FOR DESIGNING SAME

CROSS-REFERENCE TO RELATED APPLICATION

The present application is based on Japanese Priority Patent Application No. 2006-343094, filed on Dec. 20, 2006, the entire contents of which are hereby incorporated by reference.

TECHNICAL FIELD

The present invention relates generally to semiconductor apparatuses, methods of manufacturing the same, and apparatuses for designing the same.

BACKGROUND

In general, synchronous circuits are used in such a semiconductor device including a digital system as typified by an LSI. The system forming the semiconductor device is configured to operate in synchronization with a clock signal (a synchronization control signal). In the case of a large-scale system, for example, the system may be divided into multiple blocks. For example, the system may be divided into multiple medium-scale blocks, and the medium-scale blocks may be subdivided into small-scale blocks. In this case, a clock signal fed from a clock signal generator circuit branches from the medium-scale blocks to be distributed to the small-scale blocks through clock signal distribution lines.

Further, in recent high-speed, high-performance semiconductor devices, the operating frequency of a clock signal tends to be higher in order to increase operating speed. However, an increase in the operating frequency causes a problem in that a phase shift in the clock signal (skew) becomes a nonnegligible value with respect to the period of the clock signal so as to increase the risk of circuit malfunction.

Further, in recent semiconductor devices (LSIs), interconnects tend to be finer so as to increase the effect of interconnect delay. Further, there is also a growing problem of variations in interconnect delay due to variations in interconnect shape in manufacturing caused by microfabrication.

In view of the above, recent microfabricated, high-speed semiconductor devices containing synchronous digital systems have problems resulting from both an increase in the clock signal frequency (an increase in operating speed) and microfabrication (high integration). Therefore, control of clock skew has been highlighted as a problem important and difficult to solve.

Further, an interconnect delay in a clock signal distribution line is difficult to evaluate with accuracy at the stage of combining and placing the logic circuit cells of a semiconductor device (logic design stage) in designing the semiconductor device. Accordingly, controlling the effect of interconnect delay has also posed a great problem in designing the semiconductor device.

For example, as a method of controlling the above-described skew, it has been proposed to control timing by providing a semiconductor device with a predetermined circuit for skew control. Examples of methods of controlling the above-described skew include controlling timing of synchronization by providing a delay circuit, controlling timing with capacitance connected to a clock buffer, and extending the interconnect between inverters and performing control with the capacitance and resistance of the interconnect.

However, the above-described method that provides a semiconductor device with a circuit for skew control increases the complexity and size of the semiconductor device, thus posing a problem in size reduction and high integration of the semiconductor device. In particular, in the case of using fine interconnects, even if the above-described circuit for skew control is provided, there may be caused the problem of skew due to the interconnect delay of an interconnect connecting the circuit and another logic circuit cell. Thus, it is difficult to solve the problem of skew in highly integrated, high-speed semiconductor devices.

Therefore, in order to solve the above-described skew problems, there have been proposed methods of controlling skew using the fact that the resistance of an interconnect is changed by changing the cross-sectional area of the interconnect. (See, for example, Japanese Laid-Open Patent Application Nos. hei4-326411 and hei8-272480.) These methods control interconnect delay by, for example, changing the resistance of an interconnect by changing the width of the interconnect.

However, according to the above-described methods of Japanese Laid-Open Patent Application Nos. hei4-326411 and hei8-272480, since the interconnect delay is controlled with the cross-sectional area of an interconnect, there is the concern that the problem of reduction in the reliability of the interconnect due to electromigration may be caused in a fine (microfabricated) part of the interconnect. In particular, in microfabricated, highly integrated, high-performance semiconductor devices, the above-described problem of electromigration is more serious, so that there is the risk that the reliability of the semiconductor device may be reduced. Further, in a fine interconnect, there is a limit to the adjustable range of the cross-sectional area (interconnect delay) of the interconnect. Therefore, it is not practical to apply the above-described methods to highly integrated, high-performance semiconductor devices that operate at high speed.

SUMMARY

One or more semiconductor devices and methods of manufacturing a semiconductor device in various disclosures of the present invention include multiple interconnect grooves of different opening ratios.

One or more apparatuses for designing a semiconductor device in various disclosures of the present invention determine the opening ratio of an interconnect groove.

BRIEF DESCRIPTION OF THE DRAWINGS

Other objects, features and advantages of the present invention will become more apparent from the following detailed description when read in conjunction with the accompanying drawings, in which:

FIG. 16 is a flowchart showing a method of designing a semiconductor device according to a fifth embodiment of the present invention;

DETAILED DESCRIPTION OF THE EMBODIMENTS

A description is given, with reference to the accompanying drawings, of embodiments of the present invention.

Figure 1:
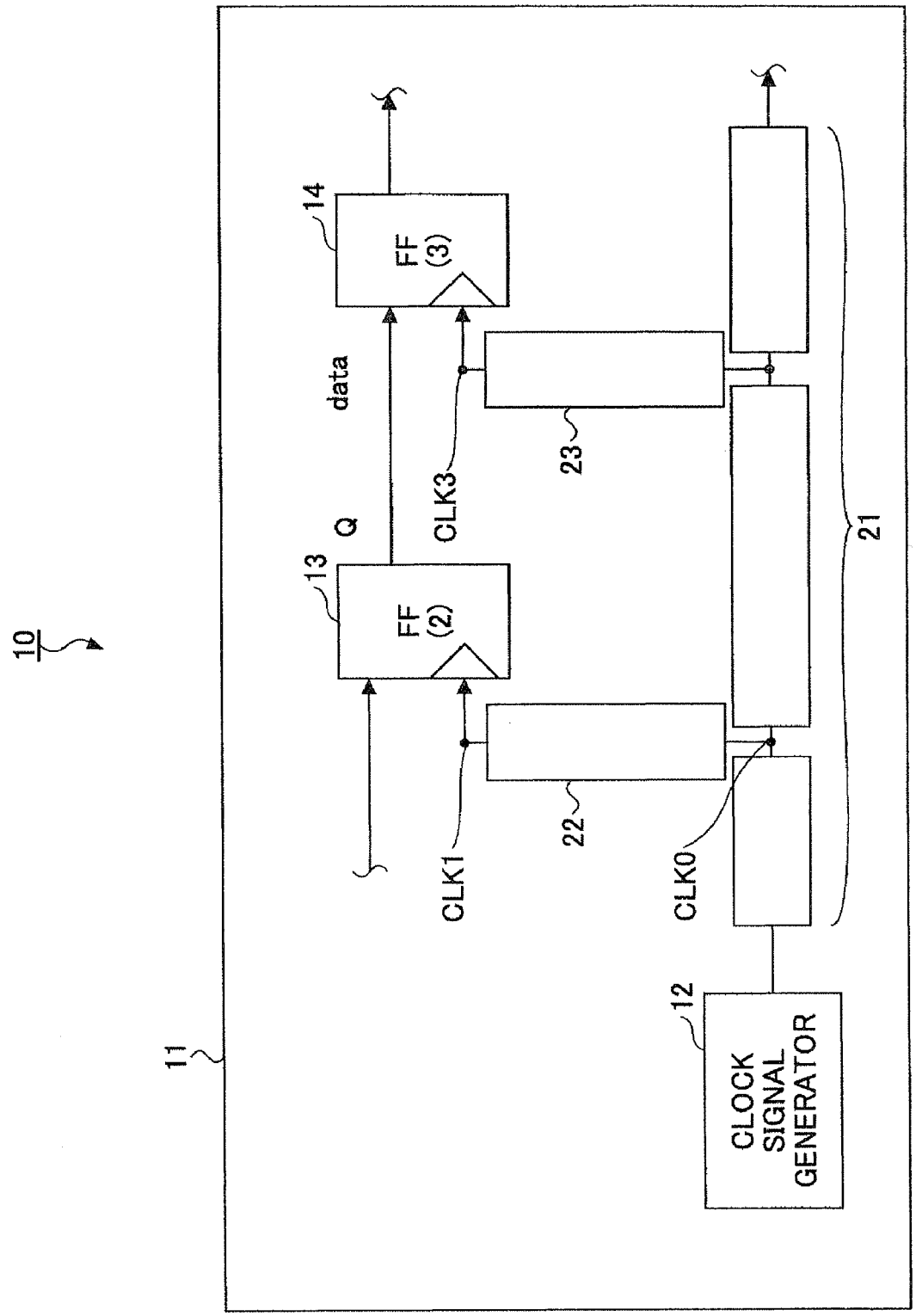
FIG. 1 is a schematic diagram showing a semiconductor device.

FIG. 1 is a schematic diagram showing a semiconductor device 10. Referring to FIG. 1, the semiconductor device 10 has multiple logic circuit cells 12, 13, and 14 formed on a substrate 11, and these logic circuit cells 12, 13, and 14 are connected through interconnects (interconnection lines) 21, 22, and 23. For example, the logic circuit cell 12 is a clock signal generator cell containing a clock signal generator circuit, which generates a clock signal (synchronization control signal) in a semiconductor device containing a digital system. Each of the logic circuit cells 13 and 14 contains, for example, a flip-flop circuit, and has a predetermined data signal input thereto or output therefrom.

The clock signal generated in the logic circuit cell (clock signal generator cell) 12 is distributed to the logic circuit cell 13 through the interconnects 21 and 22. The same clock signal is also distributed to the logic circuit cell 14 through the interconnects 21 and 23. That is, the interconnects 21, 22, and 23 correspond to clock signal distribution lines for distributing the clock signal. Further, the logic circuit cells 13 and 14 are logic circuit cells containing predetermined logic circuits, and at the same time are clock-signal-distributed cells to which the clock signal generated in the clock signal generator cell 12 is distributed.

In this configuration, each of the interconnects 22 and 23 is formed to branch from the interconnect 21. The branch point at which the interconnect 22 branches from the interconnect 21 is closer to the clock signal generator cell 12 than the branch point at which the interconnect 23 branches from the interconnect 21 is.

Therefore, the length of an interconnect (clock signal distribution line) for distributing the clock signal to the clock-signal-distributed cell 14 is greater than the length of an interconnect (clock signal distribution line) for distributing the clock signal to the clock-signal-distributed cell 13.

Accordingly, in the above-described configuration, a phase shift in the clock signal (skew) with respect to the clock-signal-distributed cell 13 is caused in the clock-signal-distributed cell 14 because of the effect of interconnect delay. This interconnect delay, which is calculated as the product of the resistance R and the parasitic capacitance C of the interconnect, may be referred to as RC delay.

The above-described generation of skew due to interconnect delay may be a serious problem in particular in a high-performance semiconductor device that operates at high speed. For example, if the operating frequency of the clock signal is increased in order to cause the semiconductor device to operate at high speed, the skew becomes a nonnegligible value with respect to the period of the clock signal, thus increasing the risk of circuit malfunction.

Further, in recent semiconductor devices (LSIs), since interconnects tend to be finer, the interconnect resistance (R) increases to increase the effect of interconnect delay. Further, in the case of forming finer interconnects, variations in interconnect shape tend to be greater because of problems in manufacturing a semiconductor device, which results in a growing problem of variations in interconnect delay.

Figure 2:
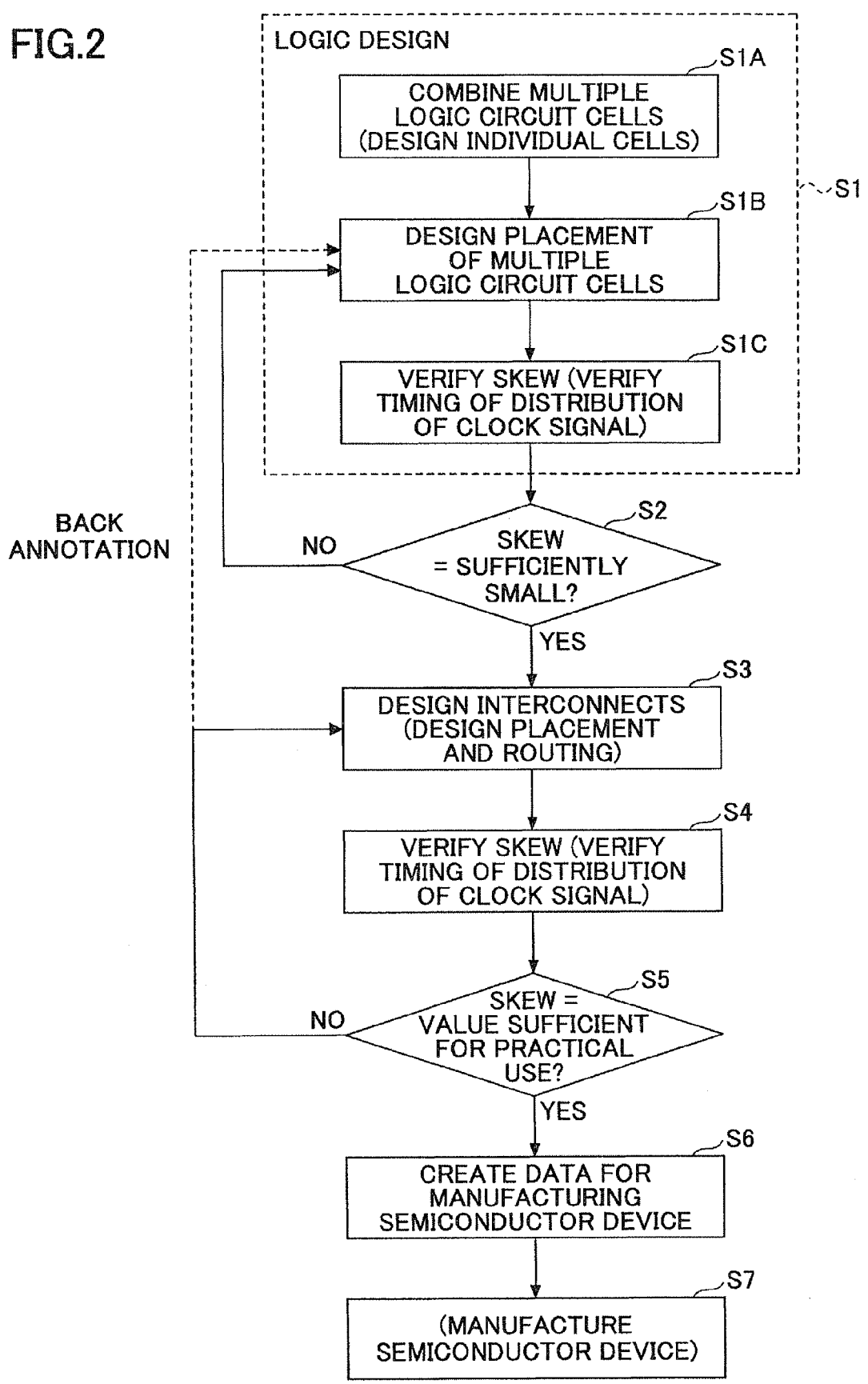
FIG. 2 is a flowchart schematically showing a method of designing a semiconductor device.

FIG. 2 is a flowchart schematically showing a method of designing a semiconductor device. Referring to FIG. 2, the method of manufacturing a semiconductor device includes a logic design process S1 (step S1) related to designing of logic circuit cells forming the semiconductor device, and an interconnect design process S3 (step S3) of designing interconnects that connect the logic circuit cells (placement and routing). That is, the logic circuit cells designed and placed in the logic design process S1 are connected through the interconnects (placement and routing) designed in the interconnect design process S3. As a result, the outline of the semiconductor device is designed.

The logic design process S1 includes a cell combining process S1A (step S1A), a cell placement design process S1B (step S1B), and a skew verification process S1C (step S1C).

First, in the cell combining process S1A, the individual logic circuit cells forming the semiconductor device are designed (combined). The logic circuit cells to be combined include a cell corresponding to the above-described clock signal generator cell 12 and cells corresponding to the above-described clock-signal-distributed cells 13 and 14.

Next, in the cell placement design process S1B, placement of the logic circuit cells is designed. That is, layout of the logic circuit cells is designed in this process.

Next, in the skew verification process S1C, skew in the placement of the logic circuit cells is verified (calculated). In this case, in this process, skew is roughly estimated using the relationship of distance based on the layout of the logic circuit cells without taking into consideration the lengths of placed and routed interconnects to be designed in a later process.

Further, in step S2, it is determined if the skew is sufficiently small. If the skew is not sufficiently small (NO in step S2), the operation returns to step S1B, and the operation restarts from step S1B (cell placement). If the skew is sufficiently small (YES in step S2), the operation proceeds to the interconnect design process S3.

Next, in the interconnect design process S3, interconnects that connect the above-described placed logic cell circuits (placement and routing) are designed. The interconnects to be designed include clock signal distribution lines corresponding to the interconnects 21, 22, and 23 described above with reference to FIG. 1.

Next, in a skew verification process S4 (step S4), skew in the case of connecting the logic circuit cells with the above-described interconnects (clock signal distribution lines) is verified (calculated). In this case, in this process, skew is calculated in view of the effect of the interconnect delay of the clock signal distribution lines by taking the lengths of the interconnects into consideration.

Further, in step S5, it is determined whether the skew is sufficiently small for practical use (circuit operations). If the skew is not sufficiently small for practical use (NO in step S5), the operation returns to step S3 to restart from step S3 (designing of placement and routing). If the skew is sufficiently small so as not to be a problem for practical use (circuit operations) (YES in step S5), the operation proceeds to step S6.

In step S6, data for manufacturing the semiconductor device are created, and in step S7, the semiconductor device is manufactured in accordance with the data.

In the above-described designing of the semiconductor device, the effect of interconnect delay is unknown in the logic design process S1. Accordingly, accurate verification of skew is performed after designing placement and routing (clock signal distribution lines) in the interconnect design process S3.

However, if, for example, the effect of interconnect delay increases because of microfabrication of the interconnects (clock signal distribution lines) as described above, it may not be possible to cause the skew to be sufficiently small by merely changing the routing of the interconnects. That is, it is necessary to return the operation not to step S3 (interconnect design) but to the logic design process S1 (for example, step S1B) in step S5 (back annotation). Occurrence of such back annotation causes loss of time in designing, thus causing the problem of an increase in the design (manufacturing) cost of the semiconductor device.

Further, as a method of solving these skew problems, it has been proposed to control skew by adding a predetermined circuit (for example, a delay circuit) to the semiconductor device. However, this method of adding a circuit for skew control to the semiconductor device increases the complexity and size of the semiconductor device, thus posing problems in size reduction and high integration of the semiconductor device.

Further, controlling skew by changing the cross-sectional area of the interconnect may cause the problem of reduction in the reliability of the interconnect due to electromigration in a fine (microfabricated) part of the interconnect. In particular, in microfabricated, highly integrated, high-performance semiconductor devices, the above-described problem of electromigration is more serious, so that there is the risk that the reliability of the semiconductor device may be reduced. Further, in a fine interconnect, there is a limit to the adjustable range of the cross-sectional area (interconnect delay) of the interconnect. Therefore, it is not practical to apply the above-described methods to highly integrated, high-performance semiconductor devices that operate at high speed.

Therefore, according to one aspect of the present invention, there is provided a high-performance semiconductor device capable of operating at high speed without a substantial decrease in the electromigration tolerance of an interconnect (without substantially impairing the reliability of an interconnect).

Therefore, a semiconductor device according to one embodiment of the present invention is configured so that skew is controlled by controlling interconnect delay by changing the resistivity of an interconnect without a substantial change in the cross-sectional area of the interconnect. Specifically, the resistivity of the interconnect is controlled by providing one or more openings in the interconnect and changing the opening ratio of the openings, thereby controlling interconnect delay. In this case, the term "opening ratio" refers to the ratio of the area of the openings to the area of the interconnect in its plan view. For example, by providing slits or dots in the interconnect, it is possible to control the resistivity of the interconnect using a so-called "size effect." A description is given below of the principle of the above-described control of resistivity.

Figure 3B:
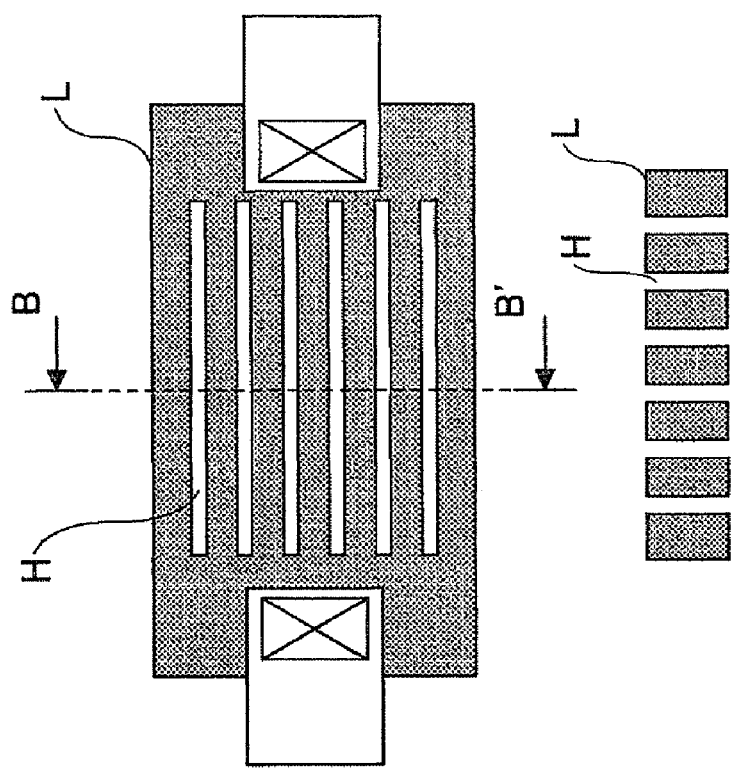
FIGS. 3A and 3B are diagrams showing a method of controlling the resistivity of an interconnect according to the present invention.
Figure 3A:
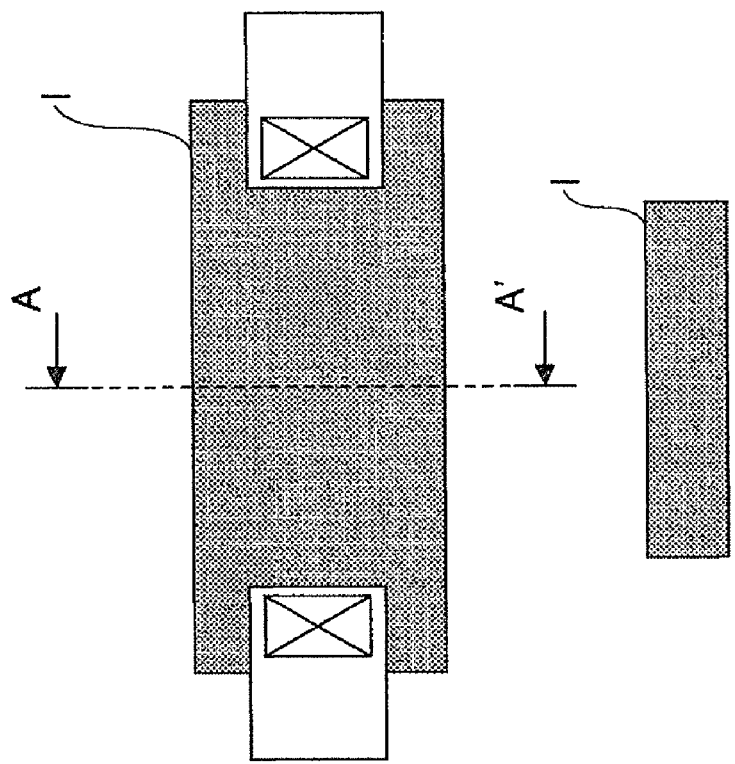

FIGS. 3A and 3B are diagrams showing interconnects l and L formed to have different opening ratios. FIG. 3A shows a plan view of the interconnect l on the upper side and a cross-sectional view thereof taken along the line A-A' on the lower side. No opening is formed in the interconnect l shown in FIG. 3A, where the opening ratio is zero.

On the other hand, FIG. 3B shows a plan view of the interconnect L on the upper side and a cross-sectional view thereof taken along the line B-B' on the lower side. Multiple openings H shaped like slits are formed in the interconnect L shown in FIG. 3B, so that a predetermined region of the interconnect L is divided into multiple regions (portions) by the openings (slits) H.

If the interconnects l and L are formed to be equal in cross-sectional area, the width of each individual divided interconnect in the interconnect L is less than the width of the interconnect l. As a result, the interconnect L is higher in resistance (resistivity) than the interconnect l because of a so-called "size effect." That is, it is possible to control the resistivity of an interconnect based on the size effect by changing the opening ratio of the interconnect.

For example, in a Cu interconnect used in a recent highly integrated LSI, the size effect that the resistance increases as the width of the interconnect decreases is known. It is said that when the horizontal scale (width) of the Cu interconnect is less than or equal to approximately 100 nm, the resistivity of the fine interconnect increases to be approximately twice the bulk resistivity. For example, if the interconnect width is approximately 130 to 180 nm, the above-described size effect is hardly a problem. However, if the interconnect width is less than or equal to approximately 65 nm, there is a conspicuous increase in interconnect delay caused by an increase in the resistance of the interconnect due to the size effect.

According to one aspect of the present invention, interconnect delay is controlled, that is, skew is controlled, by making active use of a change in the resistivity of an interconnect due to the above-described size effect.

Figure 4:
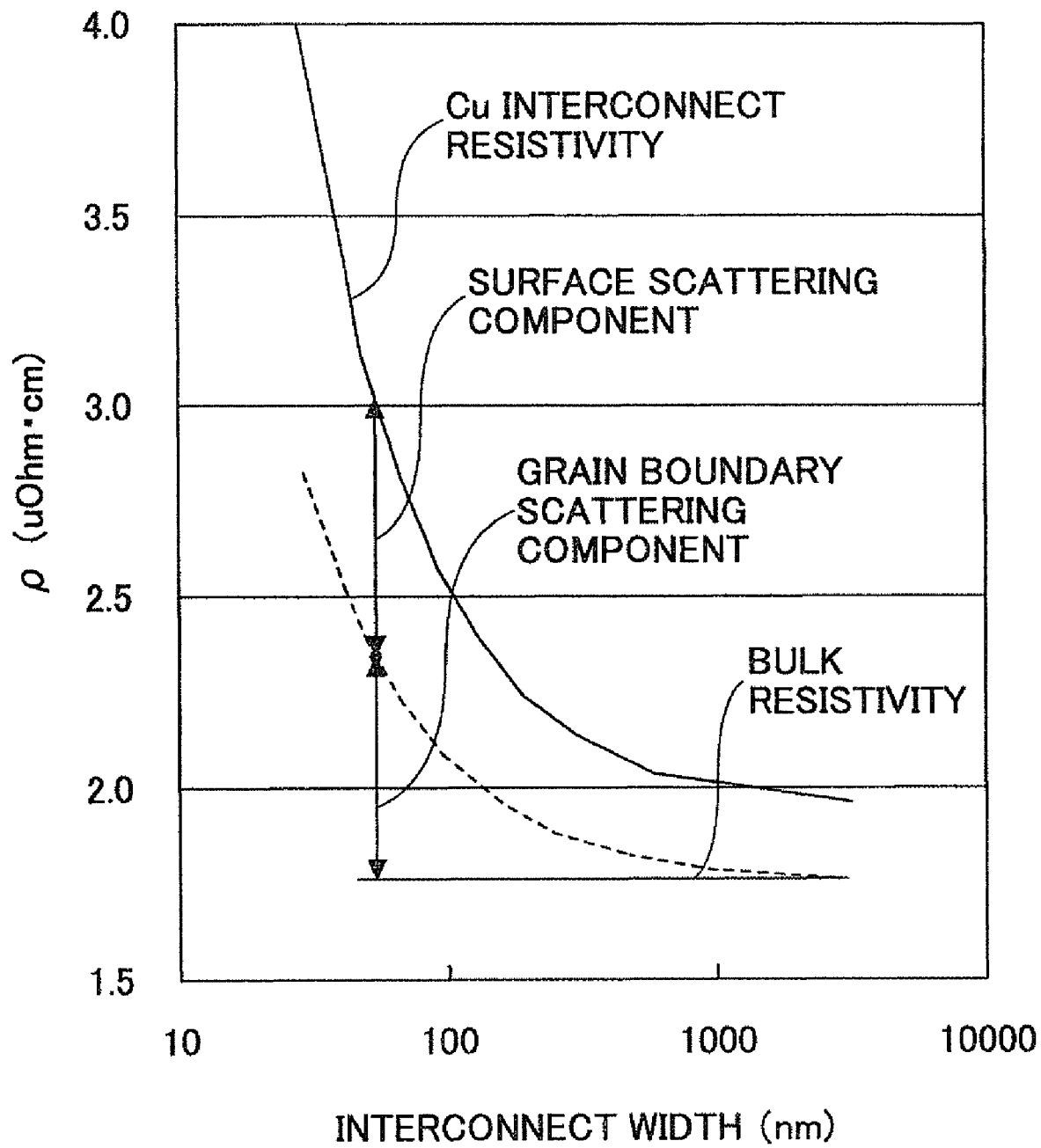
FIG. 4 is a graph showing changes in resistivity in the case of changing interconnect width according to the present invention.

FIG. 4 is a graph showing changes in resistivity in the case of changing interconnect width. FIG. 4 shows that as the interconnect width decreases, the above-described size effect becomes conspicuous so that the resistivity increases. A description is given of the cause of production of such a size effect.

The resistivity of metal at room temperature increases with increases in defects, impurities, and phonon scattering. Further, the resistivity of metal also increases because of electron scattering at a grain boundary, a surface, and an interface. For example, as the interconnect becomes finer, the above-described surface scattering and scattering at grain boundaries occur with higher probabilities. As a result, the resistivity increases so that the size effect is produced. As shown in FIG. 4, as the interconnect width decreases, the ratio of grain boundary scattering and surface scattering in the resistivity increases. In particular, there is a conspicuous increase in the resistivity due to grain boundary scattering. This phenomenon is also related to a method of manufacturing a metal interconnect as described below.

For example, Cu crystal grains grow in a heat treatment process after plating. However, in a damascene process, which forms an interconnect in a groove part (trench) by plating, the region restriction of the groove part may hinder the growth of the crystal grains if the groove part is narrow. Accordingly, the smaller (narrower) the interconnect width, the smaller the grain size, hence the greater the electron scattering. Likewise, electron scattering increases in surface scattering because of an increase in the scattering probability in horizontal directions.

According to the above-described method of controlling the resistivity (interconnect delay) of an interconnect using the size effect, interconnects can be substantially the same in cross-sectional area while changing the resistivity.

For example, according to the above-described methods of changing the cross-sectional area of an interconnect, since the cross-sectional area of an interconnect is changed, there is the risk that electromigration tolerance may decrease because of an increase in the current density of the interconnect and further the reliability of the interconnect may decrease. Further, in the above-described methods of changing the cross-sectional area of an interconnect, a change in resistivity in the case of reducing the size of the interconnect is not taken into consideration. Therefore, particularly in highly integrated semiconductor devices, there is a problem in that it is difficult to control skew.

On the other hand, according to one aspect of the present invention, there is no need to change the cross-sectional area of an interconnect. Accordingly, there is no increase in the current density of the interconnect, thus reducing the risk of reduction in the reliability of the interconnect due to electromigration.

Further, since active use is made of a change in the interconnect delay of the interconnect due to the size effect, it is possible to control skew with ease even in highly integrated semiconductor devices having microfabricated interconnects.

Next, a description is given, with reference to the accompanying drawings, of semiconductor devices using the above-described principles.

First Embodiment

Figure 5:
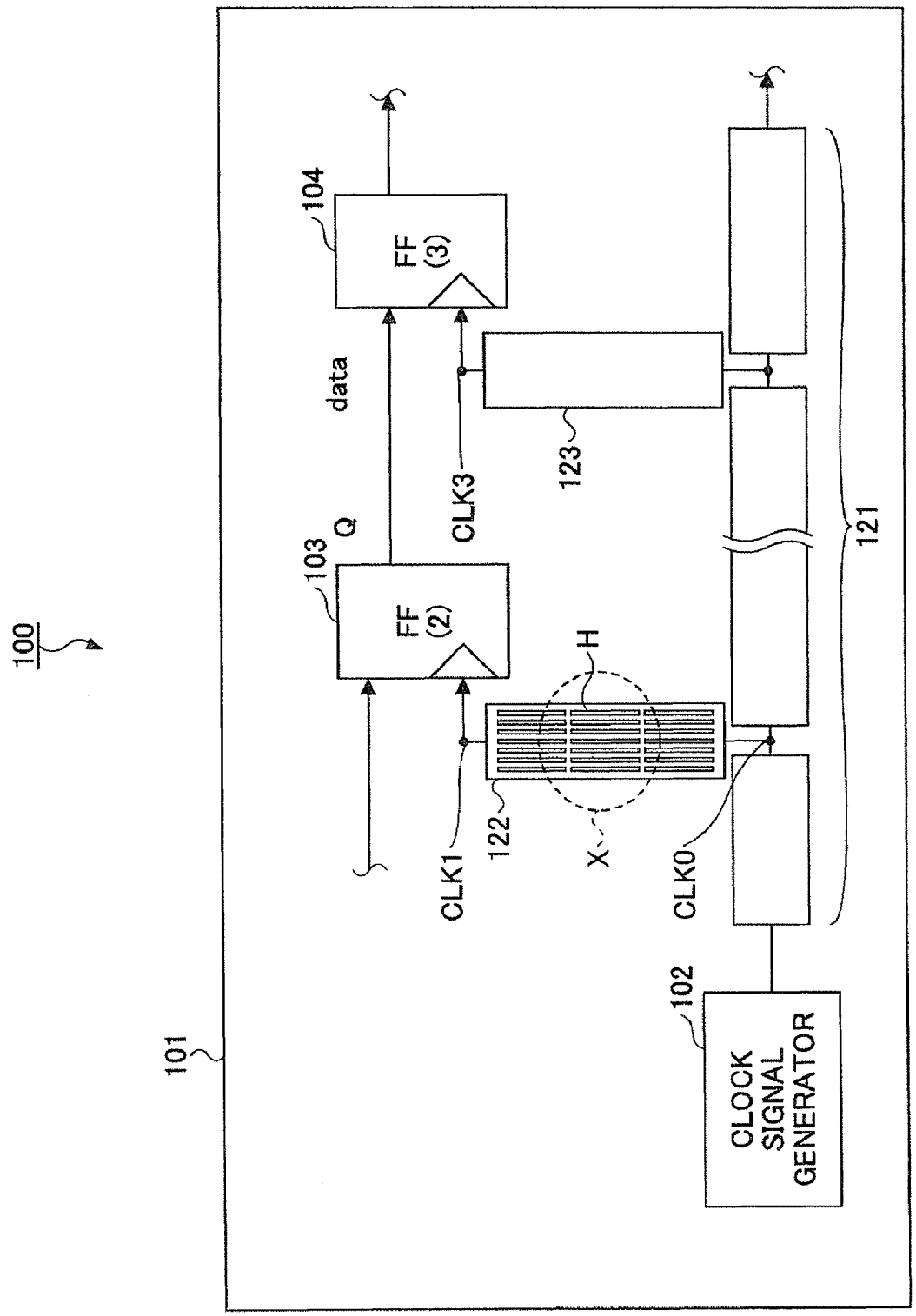
FIG. 5 is a schematic diagram showing a semiconductor device according to a first embodiment of the present invention.

FIG. 5 is a schematic diagram showing a semiconductor device 100 according to a first embodiment of the present invention. Referring to FIG. 5, the semiconductor device 100 includes a substrate 101, multiple logic circuit cells 102, 103, and 104 formed on the substrate 101, and interconnects 121, 122, and 123 that connect the logic circuit cells 102, 103, and 104. For example, the logic circuit cell 102 is a clock signal generator cell containing a clock signal generator circuit, which generates a clock signal (synchronization control signal) in a semiconductor device containing a digital system. Further, each of the logic circuit cells 103 and 104 contains, for example, a flip-flop circuit, and has a predetermined data signal input thereto or output therefrom.

The clock signal generated in the logic circuit cell (clock signal generator cell) 102 is distributed to the logic circuit cell 103 through the interconnects 121 and 122. The clock signal is also distributed to the logic circuit cell 104 through the interconnects 121 and 123. That is, the interconnects 121, 122, and 123 correspond to clock signal distribution lines for distributing the clock signal. Further, the logic circuit cells 103 and 104 are logic circuit cells containing predetermined logic circuits, and at the same time are clock-signal-distributed cells to which the clock signal generated in the clock signal generator cell 102 is distributed.

In this configuration, each of the interconnects 122 and 123 is formed to branch from the interconnect 121. The branch point at which the interconnect 122 branches from the interconnect 121 is closer to the clock signal generator cell 102 than the branch point at which the interconnect 123 branches from the interconnect 121 is.

Therefore, the length of an interconnect (clock signal distribution line) for distributing the clock signal to the clock-signal-distributed cell 104 is greater than the length of an interconnect (clock signal distribution line) for distributing the clock signal to the clock-signal-distributed cell 103.

Therefore, unless skew control is performed, that is, unless timing control is performed to delay input of the clock signal at CLK1 based on input of the clock signal at CLK3, timing error occurs. Therefore, according to this embodiment, slit control is performed by providing slit-shaped openings H in the interconnect 122 so that the interconnects 122 and 123 have different opening ratios of openings as described below. In this case, no openings are formed in the interconnect 123 (the opening ratio is zero), but the interconnect 123 may also have one or more openings provided therein.

For example, the semiconductor device 100 employed in this embodiment is formed with a 65 nm technology node. The interconnect length between CLK0 and CLK1 is 750 μm, and the interconnect length between CLK0 and CLK3 is 1000 μm. The minimum pitch of the lower-layer interconnects is 200 nm, and the minimum pitch of the intermediate-layer interconnects is 280 nm. Further, the clock signal distribution lines are formed with intermediate-layer interconnects, and the interconnect width of each clock signal distribution line is 1 μm.

The electrical characteristics before formation of the openings H in the interconnect 122 were as follow. The interconnect resistance between CLK0 and CLK1 was 60Ω, and the interconnect resistance between CLK0 and CLK3 was 83Ω. Further, the propagation delay of the clock signal was 16.6 ps between CLK0 and CLK1, and 26.2 ps between CLK0 and CLK3. The skew between CLK1 and CLK3 at this time was 9.6 ps.

According to this embodiment, the slit-shaped openings H are formed in the interconnect 122 (interconnect between CLK0 and CLK1) so that the interconnect 122 is divided into eight (widthwise).

Figure 6:
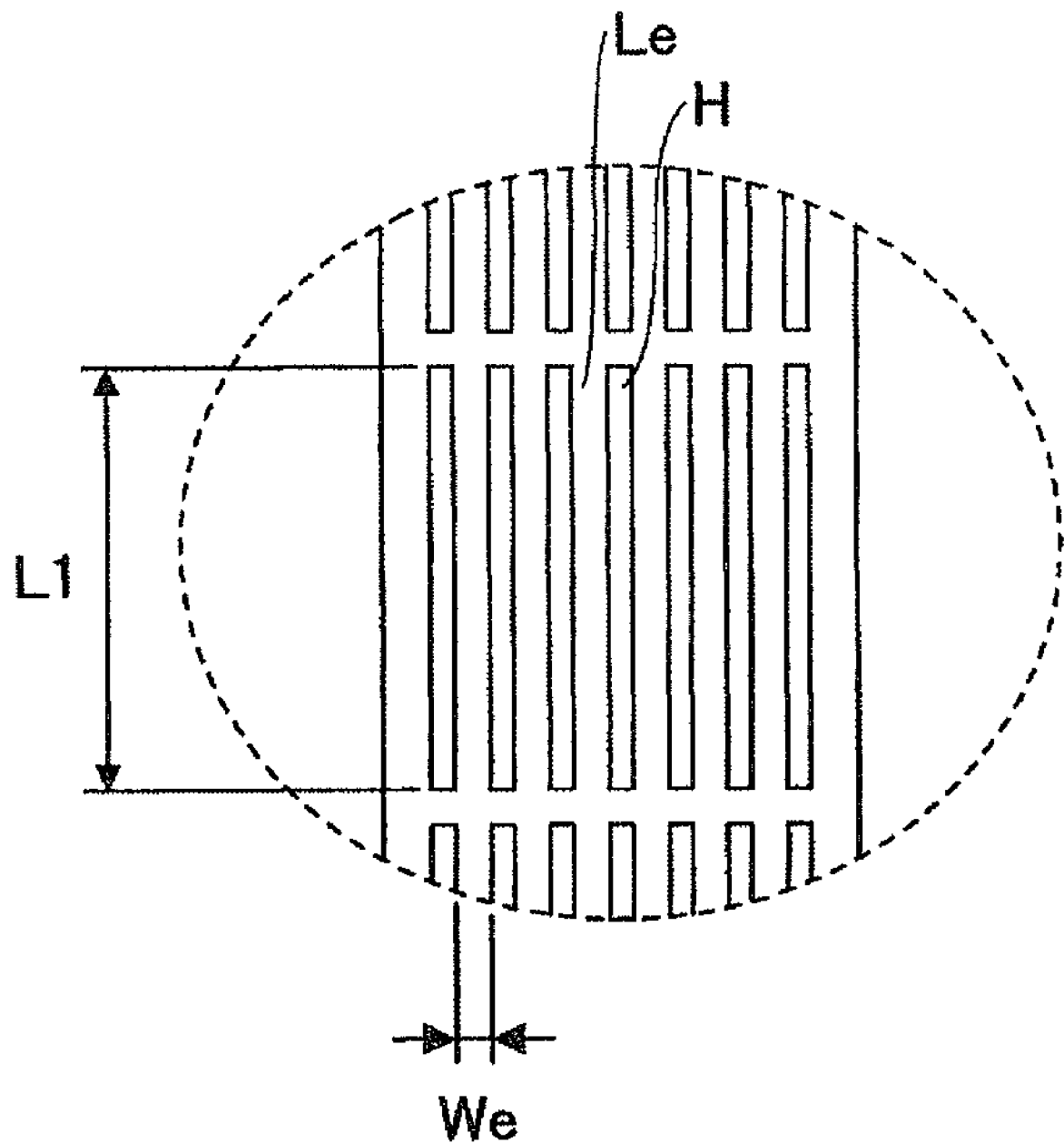
FIG. 6 is a schematic enlarged view of a part of FIG. 5 according to the first embodiment of the present invention.

FIG. 6 is a schematic enlarged view of a circled part X (interconnect 122) of FIG. 5. Referring to FIG. 6, the seven slit-shaped openings H parallel to a direction in which the interconnect 122 extends are formed in a predetermined region of the interconnect 122, so that the interconnect 122 is divided into eight parts. That is, the predetermined region of the interconnect 122 is formed of eight divided interconnects Le extending parallel to one another. The openings H are formed so that each of the interconnects Le after division has an interconnect width We of 125 nm and a length L1 of 3 μm.

Due to the difference in size effect, the resistivity of the Cu interconnect is 1.93 μΩ·cm in the case of the interconnect width of 1 μm (before division) and 2.30 μΩ·cm in the case of the interconnect width of 125 nm (after division). The resistance of the interconnect 122 was 60Ω before formation of the openings H and 94Ω after formation of the openings H. As a result, the skew was substantially zero.

Further, it is preferable that the opening ratios of interconnects (clock signal distribution lines) be determined differently in accordance with the difference in length between the interconnects as described above. For example, it is preferable that the lengths of interconnects (clock signal distribution lines) be compared and the shorter interconnect (clock signal distribution line) be determined to have a greater opening ratio than the longer interconnect (clock signal distribution line).

Second Embodiment

The number of divisions (opening ratio) of an interconnect (clock signal distribution line) and routing of the interconnect are not limited to the above, and may be varied or modified in accordance with the specifications of the semiconductor device.

Figure 7:
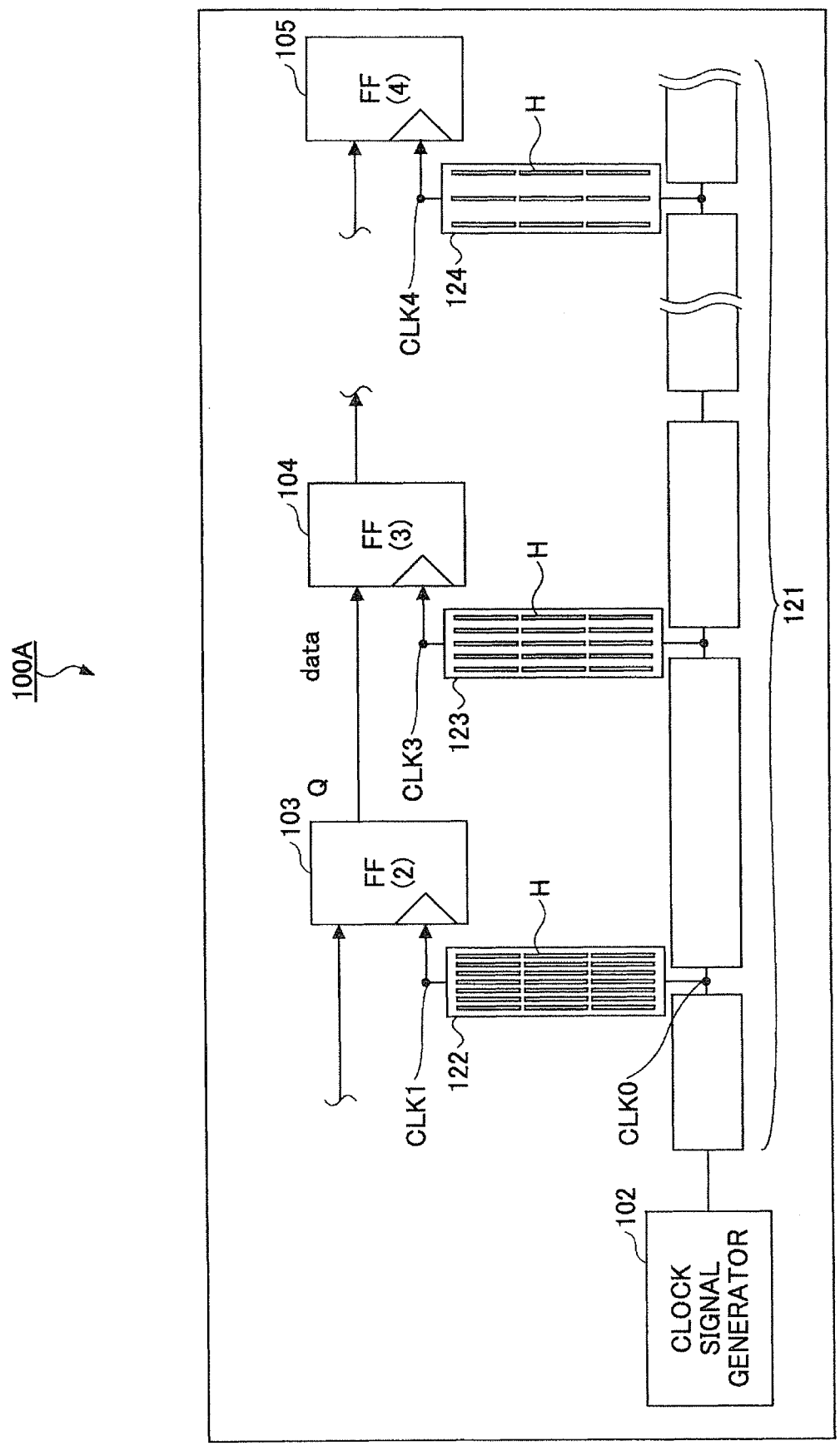
FIG. 7 is a schematic diagram showing a semiconductor device according to a second embodiment of the present invention.

FIG. 7 is a schematic diagram showing a semiconductor device 100A according to a second embodiment of the present invention. In FIG. 7, the same elements as those described above are referred to by the same reference numerals, and a description thereof is omitted.

Referring to FIG. 7, the semiconductor device 100A according to this embodiment additionally includes a logic circuit cell (clock-signal-distributed cell) 105 in the semiconductor device 100 of the first embodiment. The clock signal is distributed to the logic circuit cell 105 through an interconnect (clock signal distribution line) 124 branching from the interconnect (clock signal distribution line) 121.

In this case, the interconnect path for distributing the clock signal to the logic circuit cell 105 is longer than the interconnect path for distributing the clock signal to the logic circuit cell 104, which is longer than the interconnect path for distributing the clock signal to the logic circuit cell 103. In this case, it is preferable that the opening ratios of openings formed in the interconnects (clock signal distribution lines) 122, 123, and 124 be determined so that a shorter interconnect has a greater opening ratio than a longer interconnect based on the comparison of the lengths of the interconnects 122, 123, and 124. That is, it is preferable that the interconnect 122 have a greater opening ratio of openings than the interconnect 123 and the interconnect 123 have a greater opening ratio of openings than the interconnect 124.

By way of example, the seven slit-shaped openings H are formed in the interconnect 122 so as to divide the interconnect 122 into eight parts, the five slit-shaped openings H are formed in the interconnect 123 so as to divide the interconnect 123 into six parts, and the three slit-shaped openings H are formed in the interconnect 124 so as to divide the interconnect 124 into four parts. The number of openings and the number of divisions are not limited to the above, and may be modified in accordance with actual interconnect resistance and interconnect delay.

In the above-described manner, it is possible to control skew with ease even in a large-scale system microfabricated to have a complicated configuration.

Figure 8:
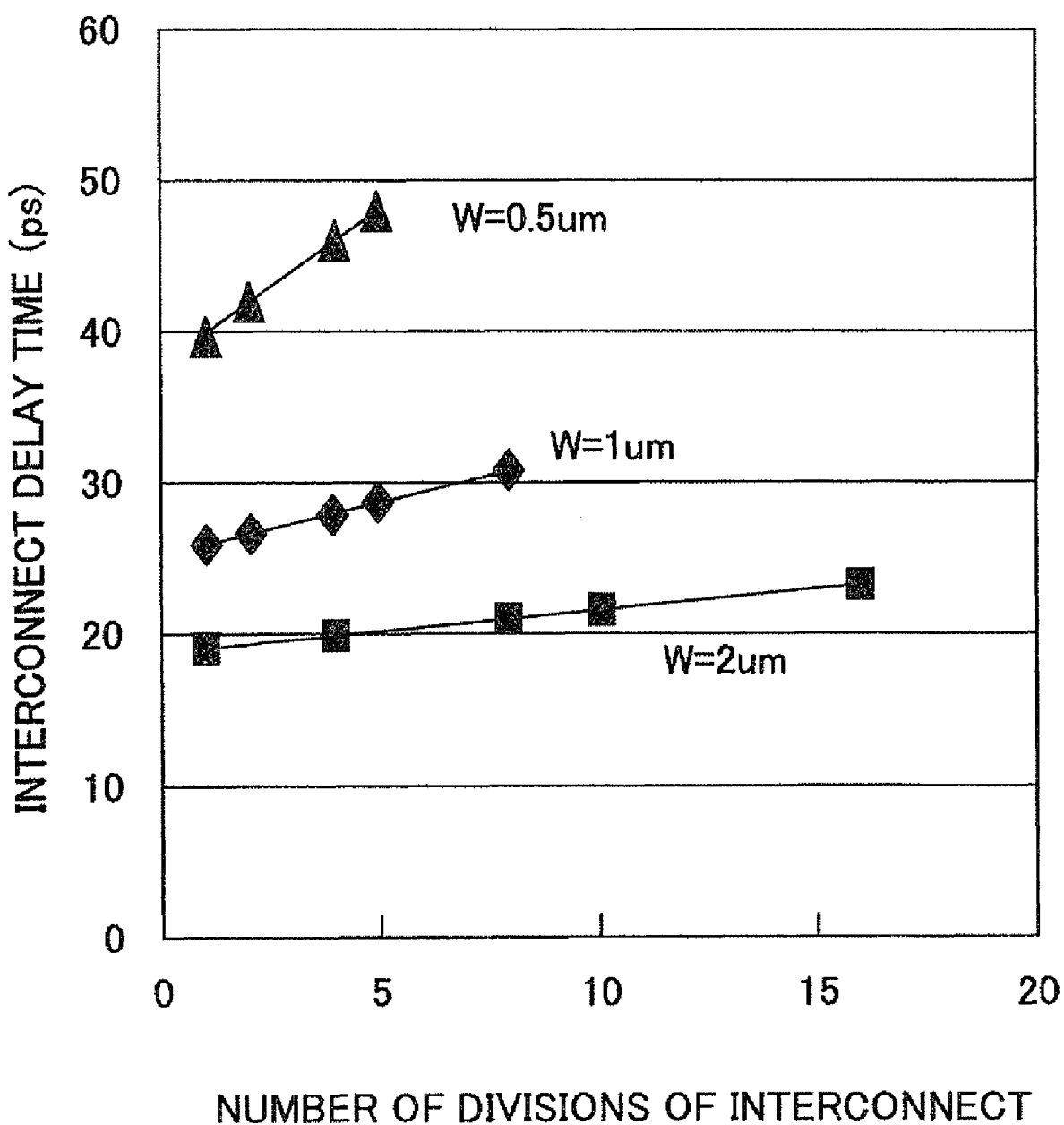
FIG. 8 is a graph showing the relationship between the number of divisions of an interconnect and the interconnect delay of the interconnect according to the second embodiment of the present invention.

FIG. 8 compares changes in interconnect delay due to the difference in the number of divisions into which a Cu interconnect is divided. The maximum number of divisions is based on processing limits. FIG. 8 shows changes in the interconnect delay time caused by changing the number of divisions of the interconnect for each of interconnect widths (W) of 0.5 μm, 1 μm, and 2 μm. In each case, the interconnect is divided so that the cross-sectional area thereof remains constant.

FIG. 8 shows that the delay time tends to increase as the number of divisions increases delay in each of the cases of the interconnect widths (0.5 μm, 1 μm, and 2 μm). The delay time thus increases because the resistivity increases because of a size effect due to an increase in the number of divisions of the interconnect.

Further, FIG. 8 also shows that it is possible to make the interconnect delay up to approximately 1.2 times as large by dividing the interconnect in each of the cases of the interconnect widths (0.5 μm, 1 μm, and 2 μm). Further, it is preferable to determine in advance the characteristic of such changes in the interconnect delay (resistivity) caused by interconnect division (changes in the opening ratio) because this makes it possible to swiftly calculate the number of divisions (opening ratio) corresponding to the amount of skew control in designing the skew control.

Further, the shape of an opening formed in the interconnect in order to control skew (interconnect delay) is not limited to the slit shape. For example, the resistivity of the interconnect may be controlled by controlling the opening ratio by forming dot-shaped openings in the interconnect. In this case also, it is possible to control skew the same as in the case of forming slit-shaped openings.

FIGS. 9A through 9D are diagrams showing variations of shapes of the openings for controlling the opening ratio formed in the interconnect L.

Figure 9A:
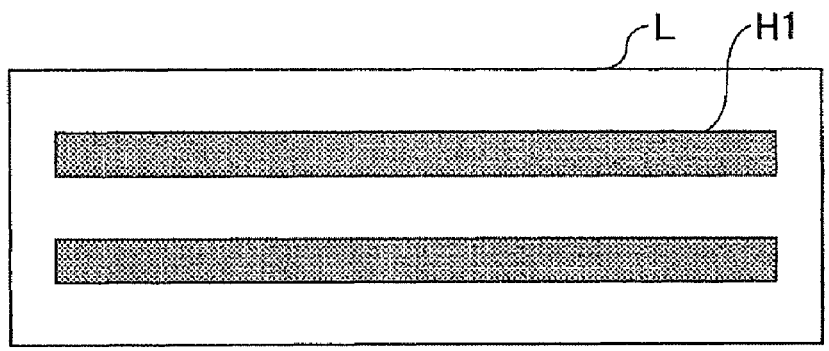
FIGS. 9A through 9D are diagrams showing variations of shapes of openings formed in the interconnect according to the second embodiment of the present invention.

For example, in the case shown in FIG. 9A, multiple slit-shaped openings H1 are formed parallel to a direction in which the interconnect L extends, so that a predetermined region of the interconnect L is divided into multiple parts (regions) by the openings H1. That is, the openings H1 have the same shape as the slit-shaped openings H shown in the above-described embodiments.

Figure 9B:
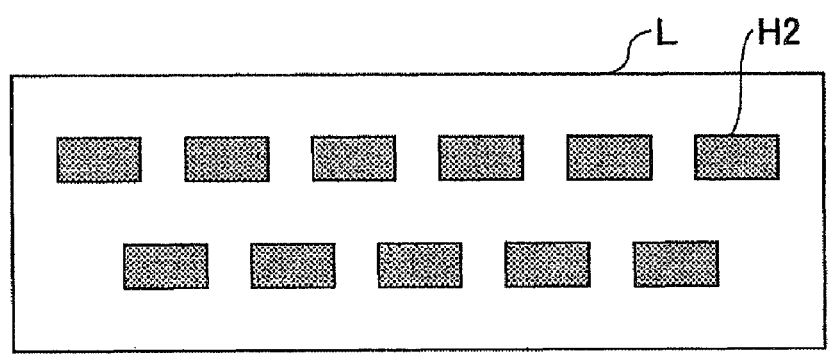

Further, in the case shown in FIG. 9B, the slit shapes of openings H2 are shorter in length than in the case of FIG. 9A. Further, the openings H2 in adjacent arrays are arranged in a staggered fashion.

Figure 9C:
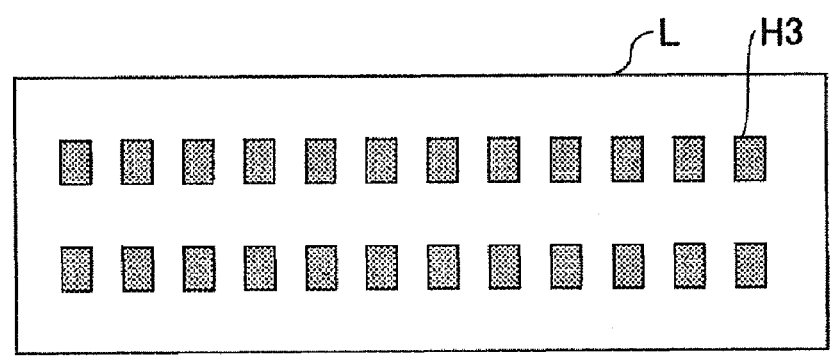

Further, in the case shown in FIG. 9C, openings H3 are shaped like dots. Multiple arrays of the equally spaced dot-shaped openings H3 are adjacently formed.

Figure 9D:
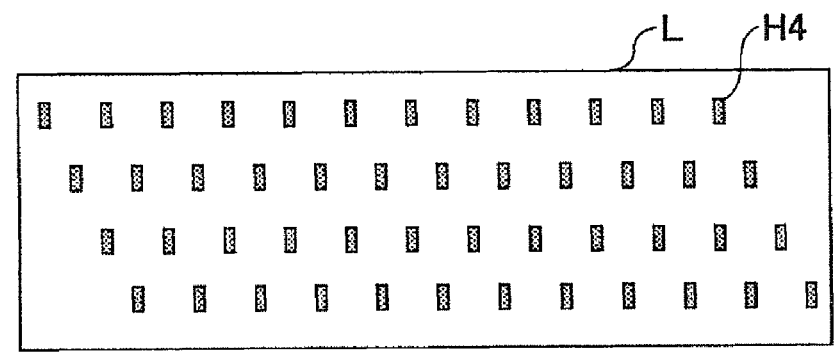

Further, in the case shown in FIG. 9D, openings H4 have dot shapes, which are smaller in size than in the case of FIG. 9C. Further, the openings H4 are arranged like a so-called hound's tooth check (like a lattice where the openings H4 in adjacent arrays are arranged in a staggered fashion).

Further, in the case of forming dot-shaped openings as shown in FIGS. 9C and 9D, the dots are not limited to those of quadrangular shapes as described above. Alternatively, the dots may have polygonal shapes such as triangular, pentagonal, and hexagonal shapes, circular shapes, or elliptic shapes.

Third Embodiment

In the above embodiments, a description is given of control of interconnect delay (skew) resulting from the difference in length between multiple interconnects (difference in length between interconnect paths), focusing mainly on the difference in length between interconnects (clock signal distribution lines). However, the present invention is not limited to this, and it is also possible to control interconnect delay (skew) resulting from, for example, the difference in height between multiple interconnects.

For example, in a semiconductor device formed with a multilayer interconnection structure, it is preferable that interconnects be basically equal in height in each layer. However, the interconnects may differ in height because of problems in the manufacturing process of the semiconductor device.

For example, in the case of forming a Cu interconnect with a damascene process, it is a common practice to remove excessive Cu by CMP (Chemical Mechanical Polish) after embedding Cu in a groove part. However, in the case of employing CMP, the amount of polishing differs between interconnects to be polished because of the difference in width between the interconnects or the difference between densities with which the interconnects are formed. As a result, the interconnects may be formed with different heights. This is a phenomenon referred to as dishing or erosion. This phenomenon also results from the difference in polishing rate between the metal material (Cu) to be polished and a part around the metal material (interlayer insulating film).

Figure 10A:
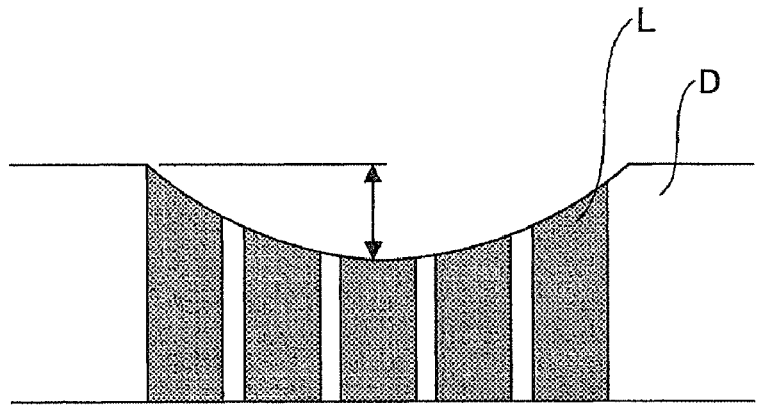
FIGS. 10A and 10B are diagrams each showing a case where there is a difference in height between multiple interconnects.
Figure 10B:
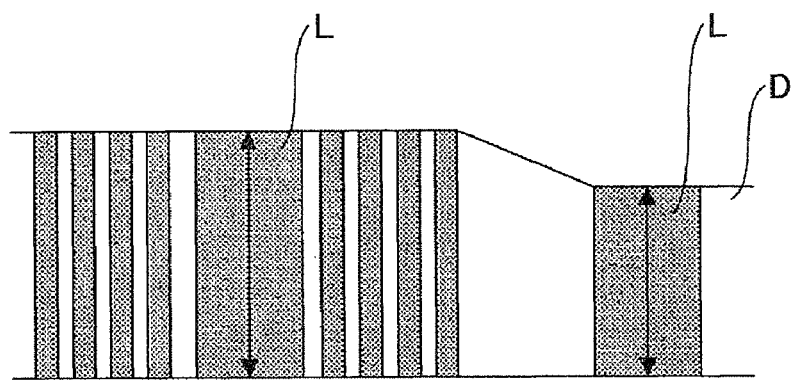

FIGS. 10A and 10B are schematic diagrams showing typical cases where CMP causes variations in interconnect height. FIG. 10A shows a case where variations in interconnect height result from the difference in polishing rate between the interconnects L and an interlayer insulating film D. In this case, the polishing rate is high in those in the center of the close-packed interconnects L, and is low in those in the periphery of the close-packed interconnects L compared with those in the center, thus causing variations in interconnect height.

If the interconnects L are formed with different densities or interconnect widths (patterns) with respect to the interlayer insulating film D, the polishing rate differs between parts in which the densities or patterns of the interconnects L are different from each other. FIG. 10B shows such a case.

Further, the amount of polishing by CMP is also dependent on the initial film thickness before polishing. Accordingly, a difference in film thickness between regions in a chip causes a variation in interconnect resistance. This phenomenon is also affected by the size and density of adjacent patterns in the chip, and recently has been taken seriously as an element to provide variations in delay.

Further, variations in interconnect height may also be caused by plating in the case of forming Cu interconnects. For example, the deposition rate of plating may differ depending on various conditions (for example, the size and area of an interconnect pattern).

Figure 11:
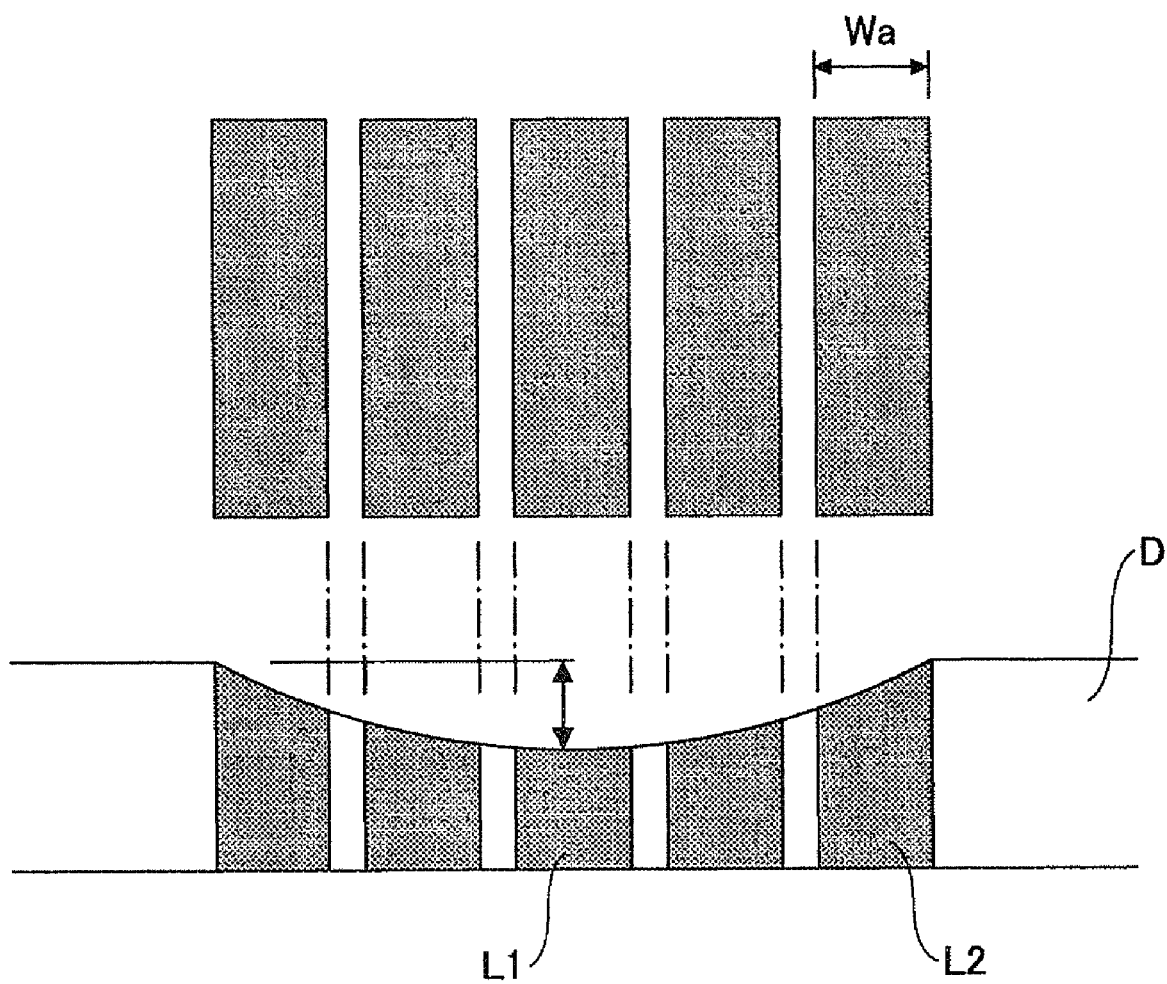
FIG. 11 is a diagram showing multiple interconnects with different heights.
Figure 12:
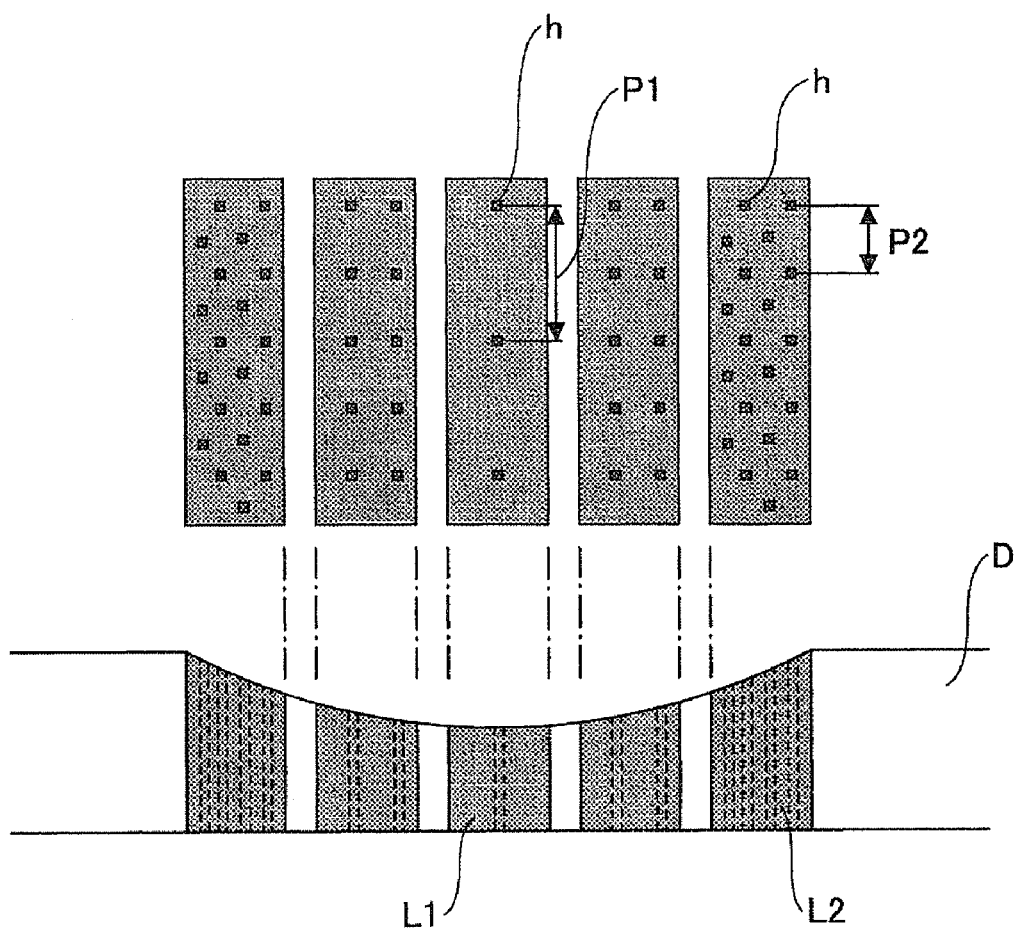
FIG. 12 is a diagram showing a semiconductor device according to a third embodiment of the present invention.

In this embodiment, a more specific description is given, with reference to FIGS. 11 and 12, of the case of controlling interconnect delay by forming openings when variations are caused in interconnect height for manufacturing reasons as described above.

FIG. 11 is a diagram showing multiple interconnects in the interlayer insulating film D after being polished by CMP. FIG. 11 schematically shows a plan view on the upper side and a cross-sectional view on the lower side. For example, if interconnects are wide (large in width) and narrowly spaced (at small intervals), the effect of dishing and erosion tends to be greater. In the case shown in FIG. 11, of the multiple close-packed interconnects, an interconnect L1 around the center receives a large amount of polishing, and an interconnect L2 in the periphery receives a small amount of polishing. This causes the interconnects to be non-uniform in height, so that a desired resistance may not be obtained.

Each of the interconnects L1 and L2 has an interconnect width Wa of 3 μm, and the center interconnect L1 is smaller in height than the peripheral interconnect L2 by approximately 200 nm. The interconnect L1 has a resistance of 44.6 Ω/mm, and the interconnect L2 has a resistance of 40.6 Ω/mm. That is, the interconnect L1 is approximately 1.1 times higher in resistance than the interconnect L2 because the interconnect L1 is smaller in height.

FIG. 12 shows the case of controlling resistance (interconnect delay) by forming multiple dot-shaped openings h in each of the interconnects of FIG. 11 so that the interconnects have different opening ratios. For example, it is preferable that the opening ratios of the openings h formed in the interconnects be determined differently in accordance with the difference in height between the interconnects. That is, it is preferable that the interconnects have different opening ratios corresponding to their respective heights. Specifically, it is preferable that the heights of the multiple interconnects including the interconnects L1 and L2 be compared, and that a higher interconnect (for example, the interconnect L2) be provided with a greater opening ratio (for example, dot density) than a lower interconnect (for example, the interconnect L1).

For example, in the case shown in FIG. 12, the openings (dots) h are formed at intervals P1 of 1000 nm in the interconnect L1, while the openings (dots) h are formed at intervals P2 of 200 nm in the interconnect L2.

As a result of forming the openings h as described above, the interconnect L1 has a resistivity of 1.94 μΩ·cm and an interconnect resistance of 45.3 Ω/mm, and the interconnect L2 has a resistivity of 2.14 μΩ·cm and an interconnect resistance of 45.6 Ω/mm. That is, the interconnects L1 and L2 can have substantially the same interconnect resistance although the interconnects L1 and L2 are different in height. There is no substantial difference in the change of the interconnect capacitance (C) between the interconnect L1 and the interconnect L2. Accordingly, if the interconnects L1 and L2 have the same interconnect resistance (R), the interconnects L1 and L2 have the same interconnect delay (RC delay).

Fourth Embodiment

In general, multiple semiconductor devices (semiconductor chips) are simultaneously formed using a single semiconductor wafer. In this case, the interconnect resistance may differ between chips because of problems in the manufacturing process of the semiconductor devices.

Figure 13:
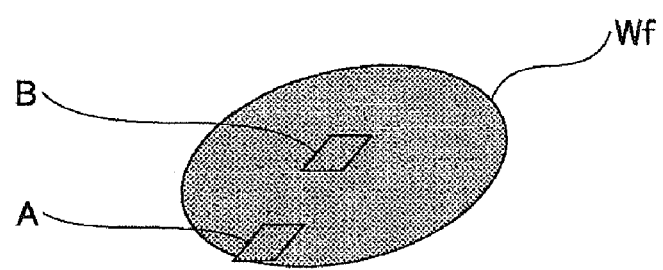
FIG. 13 is a diagram showing a wafer.

FIG. 13 is a schematic diagram showing a semiconductor wafer Wf in which semiconductor chips are formed. For example, the amount of CMP polishing may differ between a peripheral part A and a part B near the center of the wafer Wf, so that interconnects to be formed may be different in height.

Figure 14A:
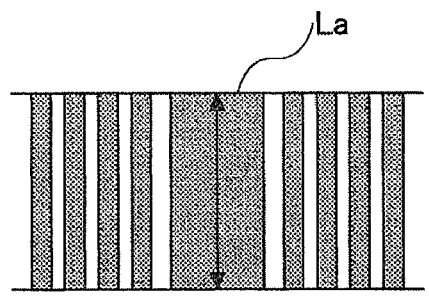
FIGS. 14A and 14B are diagrams showing a case where there is a difference in height between multiple interconnects.
Figure 14B:
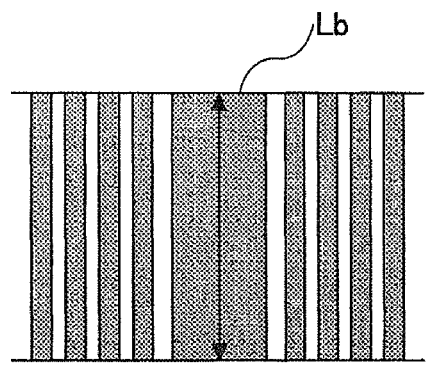

FIGS. 14A and 14B are diagrams showing multiple interconnects after being subjected to CMP polishing. FIG. 14A shows an interconnect La in the periphery of a wafer (corresponding to the peripheral part A of FIG. 13). FIG. 14B shows an interconnect Lb in a part near the center of the wafer (corresponding to the center-near part B of FIG. 13). As shown in FIGS. 14A and 14B, there may be a difference in the amount of CMP polishing in the plane of the wafer. For example, the amount of polishing may be greater for, for example, the interconnect La (the periphery of the wafer) depending on the conditions of CMP. As a result, the interconnects are not uniform in height, so that a desired resistance may not be obtained. That is, there may be a difference in interconnect height not only in an individual semiconductor chip but also between different semiconductor chips.

Each of the interconnects La and Lb has an interconnect width of 3 μm, and the interconnect La is smaller in height than the interconnect Lb by approximately 200 nm. The interconnect La has a resistance of 44.6 Ω/mm, and the interconnect Lb has a resistance of 40.6 Ω/mm. That is, the interconnect La is approximately 1.1 times higher in resistance than the interconnect Lb because the interconnect La is smaller in height.

Figure 15A:
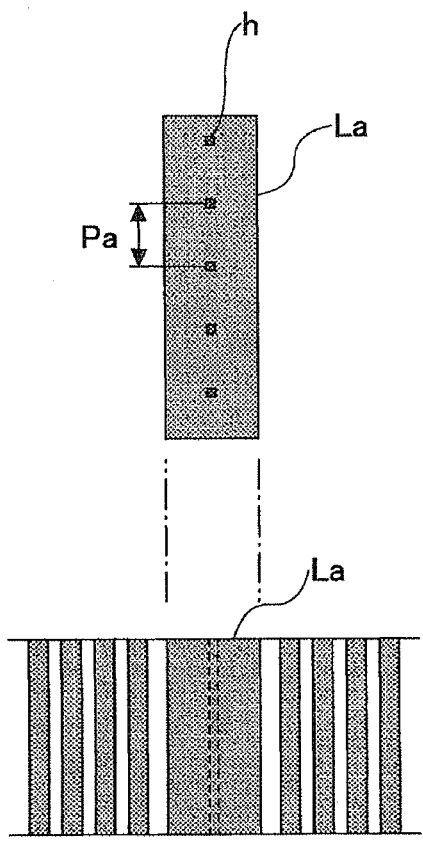
FIGS. 15A and 15B are diagrams showing a semiconductor device according to a fourth embodiment of the present invention.
Figure 15B:
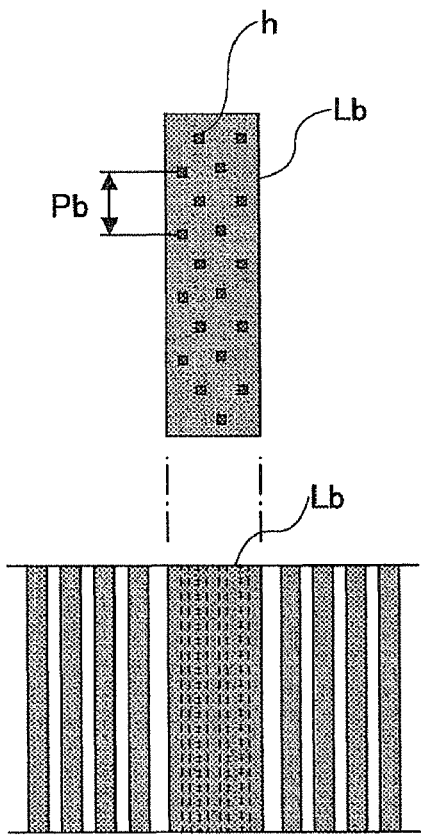

FIGS. 15A and 15B show the cases of controlling resistance (interconnect delay) by forming the dot-shaped openings h in the interconnects La and Lb of FIGS. 14A and 14B, respectively, so that the interconnects La and Lb have different opening ratios. For example, it is preferable that the opening ratios of the openings h formed in the interconnects La and Lb be different in accordance with the difference in height between the interconnects La and Lb the same as in the case of the third embodiment.

For example, in the cases shown in FIGS. 15A and 15B, the openings (dots) h are formed at intervals Pa of 1000 nm in the interconnect La, and the openings (dots) h are formed at intervals Pb of 200 nm in the interconnect Lb.

As a result of forming the openings h as described above, the interconnect La has a resistivity of 1.94 $\mu\Omega \cdot cm$ and an interconnect resistance of 45.3 $\Omega/mm$, and the interconnect Lb has a resistivity of 2.14 $\mu\Omega \cdot cm$ and an interconnect resistance of 45.6 $\Omega/mm$. Thus, it is also possible to control interconnect resistance (interconnect delay) between different chips.

Fifth Embodiment

Next, a description is given of the procedure of a designing method in the case of designing these semiconductor devices.

FIG. 16 is a flowchart schematically showing a method of designing a semiconductor device (semiconductor device designing method) according to a fifth embodiment of the present invention. Referring to FIG. 16, the semiconductor device designing method according to this embodiment includes a logic design process S10 (step S10) related to designing of logic circuit cells forming the semiconductor device, an interconnect design process S20 (step S20) of designing interconnects that connect the logic circuit cells (placement and routing), and an opening ratio selection process S30 (step S30) of selecting the opening ratio of openings to be formed in an interconnect part.

That is, the multiple logic circuit cells designed and placed in the logic design process S10 are connected by the interconnects (placement and routing) designed in the interconnect design process S20, and the opening ratio of an interconnect part is selected in consideration of the lengths and, if necessary, the heights of the interconnects in the opening ratio selection process S30.

The logic design process S10 includes a cell combining process S10a (step S10a), a cell placement design process S10b (step S10b), and a skew verification process S10c (step S10c).

First, in the cell combining process S10a, the individual logic circuit cells forming the semiconductor device are designed (combined). The logic circuit cells to be combined include a cell corresponding to the above-described clock signal generator cell 102 and cells corresponding to the above-described clock-signal-distributed cells 103 and 104 shown in FIG. 5.

Next, in the cell placement design process S10b, placement of the logic circuit cells is designed. That is, layout of the logic circuit cells is designed in this process.

Next, in the skew verification process S10c, skew in the placement of the logic circuit cells is verified (calculated). In this case, in this process, skew is roughly estimated using the relationship of distance based on the layout of the logic circuit cells without taking into consideration the lengths of placed and routed interconnects designed in a later process.

Further, in step S10A, it is determined if the skew is sufficiently small. If the skew is not sufficiently small (NO in step S10A), the operation returns to step S10b, and the operation restarts from step S10b (cell placement). If the skew is sufficiently small (YES in step S10b), the operation proceeds to step S20.

Next, in the interconnect design process S20, interconnects that connect the above-described placed logic cell circuits (placement and routing) are designed. The interconnects to be designed include clock signal distribution lines corresponding to the interconnects 121, 122, and 123 described above with reference to FIG. 5.

Here, the designing method according to this embodiment includes the opening ratio selection process S30 of selecting the opening ratios of openings to be formed in the above-described (placed and routed) interconnects. The opening ratio selection process S30 includes a process S30a of selecting (calculating) the opening ratios of the openings of the interconnects (step S30a) and a process S30b of verifying skew (step S30b).

First, in step S30a, the opening ratios of openings to be formed in the interconnects designed in previous step S20 are calculated. In this case, the interconnect resistance Rx of each interconnect is calculated from the interconnect width Wx and interconnect length Lx of the interconnect, and the opening ratio of each interconnect is calculated so that the interconnect resistance Rx (interconnect delay RCx) of the interconnect is a desired value or within a desired range of variations.

Further, the above-described interconnect resistance Rx (interconnect delay RCx) is calculated, assuming that the interconnect heights Hx of the interconnects are basically uniform. In this process, however, the interconnect resistance Rx (interconnect delay RCx) of each interconnect may also be calculated in consideration of variations in the interconnect heights Hx of the interconnects as required.

For example, variations in interconnect height are often caused by various problems in manufacturing a semiconductor device as described above in the third and fourth embodiments.

Therefore, data on such variations in interconnect height may be obtained in advance, and the interconnect resistance Rx (interconnect delay RCx) of each interconnect may be calculated using the data (as described below).

Next, in step S30b, the skew of the entire system of the semiconductor device is calculated using the value of the interconnect resistance Rx (interconnect delay RCx) of each interconnect having its resistivity controlled with the opening ratio of the openings.

Next, in step S30A, it is determined whether the skew of the entire system of the semiconductor device is sufficiently small for practical use (circuit operations). If the skew is not sufficiently small for practical use (NO in step S30A), the operation returns to step S30a to restart from step S30a. If the skew is sufficiently small so as not to be a problem for practical use (circuit operations) (YES in step S30A), the operation proceeds to step S40.

In step S40, data for manufacturing the semiconductor device are created, and in step S50, the semiconductor device is manufactured in accordance with the data.

According to the above-described semiconductor device designing method, it is possible to control the skew of the system of the semiconductor device with ease by controlling interconnect resistance (interconnect delay) by changing the resistivity of an interconnect without causing a substantial change in the cross-sectional area of the interconnect. Therefore, it is possible to easily design a high-performance semiconductor device capable of operating at high speed without causing a substantial decrease in the electromigration tolerance of an interconnect (without substantially impairing the reliability of an interconnect).

Further, according to the above-described semiconductor device designing method, greater control is allowed for interconnect resistance, so that back annotation (re-performing logic designing) as described above with reference to FIG. 2 is less likely to occur. That is, according to the above-described semiconductor device designing method, the design cost (manufacturing cost) of the semiconductor device is reduced. By using the above-described method, it is possible to control interconnect delay with ease even in, for example, microfabricated (highly integrated) semiconductor devices, where it has been difficult to control interconnect delay.

Further, in the above-described semiconductor device designing method, for example, actual manufacturing data (actually measured manufacturing data) of the semiconductor device may be fed back and used, instead of design values (so-called design dimensions), as the dimensions (such as height) of an interconnect used for skew verification.

For example, according to CMP, there may be a difference in the amount of polishing (polishing rate) between interconnects depending on their shapes or densities, so that there may be a difference in height between the interconnects so as to prevent a desired interconnect resistance from being obtained.

Therefore, for example, data Gx on the amount of polishing by CMP may be obtained in advance. It is possible to control interconnect resistance (interconnect delay) with better accuracy by using the interconnect height Hx in which the data Gx on the amount of CMP polishing are considered in calculating the interconnect resistance (interconnect delay) in step S30 described above.

Further, the interconnect shape in manufacturing that is thus fed back is not limited to the interconnect height Hx. For example, data Ex on variations in interconnect width in a photoetching process may be obtained in advance and fed back for calculating interconnect resistance. That is, it is possible to control interconnect resistance (interconnect delay) with better accuracy by using the interconnect width Wx in which the data Ex are considered in calculating the interconnect resistance (interconnect delay) in step S30 described above.

Sixth Embodiment

Figure 17:
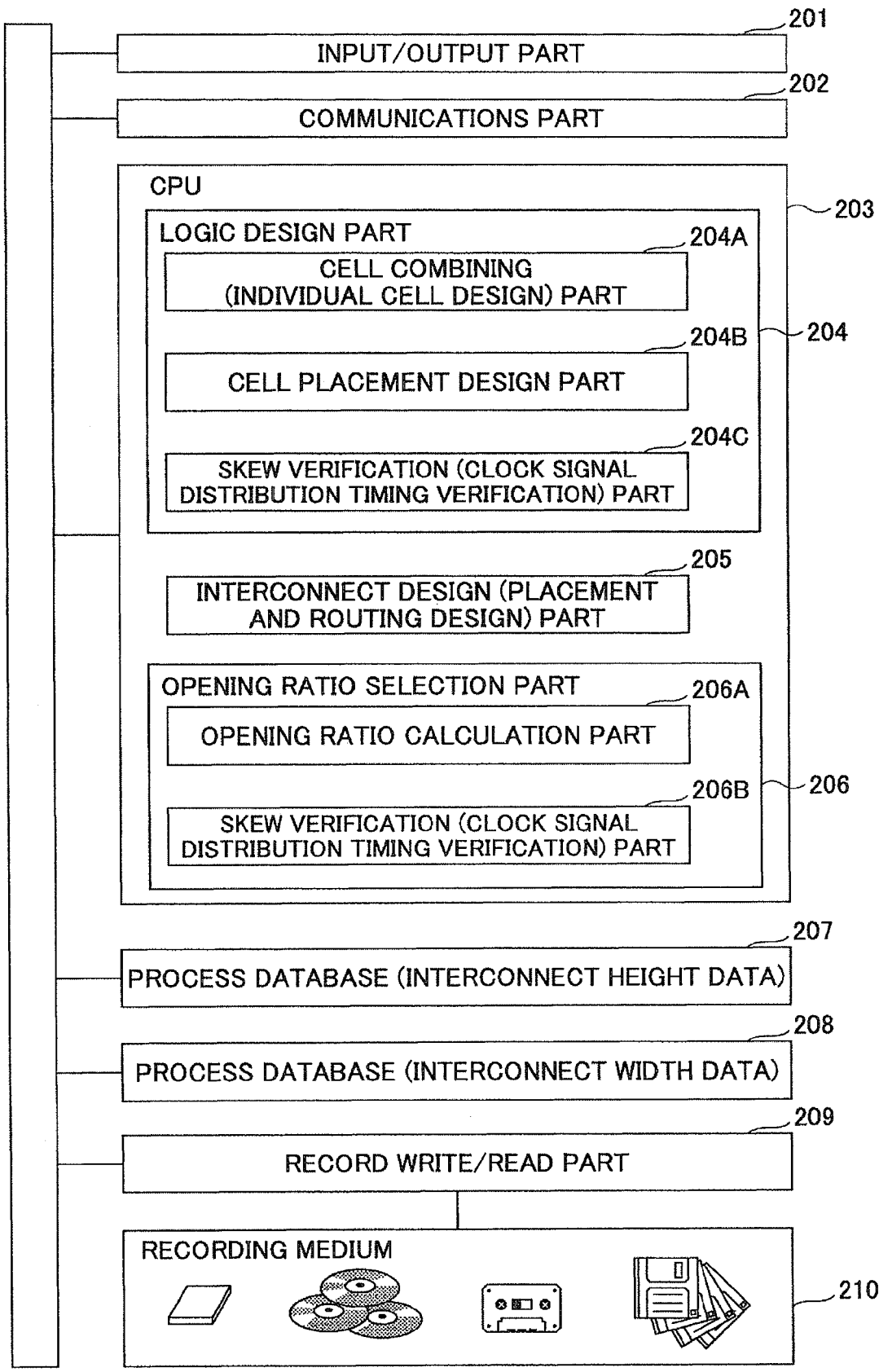
FIG. 17 is a diagram showing an apparatus for designing a semiconductor device according to a sixth embodiment of the present invention.

FIG. 17 is a schematic diagram showing an apparatus 200 for designing a semiconductor device (semiconductor device designing apparatus 200) according to a sixth embodiment of the present invention, which apparatus 200 executes the above-described semiconductor device designing method.

Referring to FIG. 17, the semiconductor device designing apparatus 200 according to this embodiment includes an input/output part 201, a communications part 202, a CPU (computer) 203, process databases (memories) 207 and 208, a record write/read part 209, and a recording medium 210.

Further, the CPU (computer) 203, which executes the semiconductor device designing method shown in FIG. 16, includes a logic design part 204, an interconnect design part 205, and an opening ratio selection part 206.

In the above-described configuration, the logic design part 204 executes steps S10 and S10A shown in FIG. 16, the interconnect design part 205 executes step S20 shown in FIG. 16, and the opening ratio selection part 206 executes steps S30 and S30A shown in FIG. 16.

Further, the logic design part 204 includes a cell combining part 204A, a cell placement design part 204B, and a skew verification part 204C. Further, the opening ratio selection part 206 includes an opening ratio calculation part 206A and a skew verification part 206B.

In the above-described configuration, the cell combining part 204A executes step S10a shown in FIG. 16, the cell placement design part 204B executes step S10b shown in FIG. 16, and the skew verification part 204C executes steps S10c and S10A shown in FIG. 16.

Further, the interconnect design part 205 executes step S20 shown in FIG. 16, the opening ratio calculation part 206A executes step S30a shown in FIG. 16, and the skew verification part 206B executes steps S30b and S30A shown in FIG. 16.

According to the above-described semiconductor device designing apparatus 200, the same effects as in the case described in the fifth embodiment are produced. Further, in the above-described semiconductor device designing apparatus 200, for example, actual manufacturing data (actually measured manufacturing data) of the semiconductor device may be fed back and used, instead of design values (so-called design dimensions), as the dimensions (such as height) of an interconnect used for skew verification. In this case, it is preferable, for example, to obtain data on interconnect height (the data Gx on the amount of CMP polishing) in advance and store the obtained data in the process database 207.

In this case, it is possible to control interconnect resistance (interconnect delay) with better accuracy by using the interconnect height Hx in which the data Gx on the amount of CMP polishing are considered by reading out the data Gx on the amount of CMP polishing from the process data base 207 and using the data in the opening ratio calculation part 206A calculating the interconnect resistance (interconnect delay).

Further, the interconnect shape in manufacturing that is thus fed back is not limited to the interconnect height Hx. It is preferable, for example, to obtain data on interconnect width (for example, the data Ex on variations in interconnect width in a photoetching process) in advance and store the obtained data in the process database 208.

In this case, it is possible to control interconnect resistance (interconnect delay) with better accuracy by using the interconnect width Wx in which the width variation data Ex are considered by reading out the data Ex from the process database 208 and using the data in the opening ratio calculation part 206A calculating the interconnect resistance (interconnect delay).

Alternatively, such process data may also be input from the input/output part 201 or the communications part 202.

Further, a program for causing the CPU (computer) 203 to execute the semiconductor device designing method shown in FIG. 16 may be pre-recorded in the recording medium 210. In this case, the program is read by the record write/read part 209 and executed by the CPU 203. Alternatively, the program may also be input from the input/output part 201 or the communications part 202.

Seventh Embodiment

Next, a description is given, with reference to FIGS. 18A through 18D and FIGS. 19A and 19B, of a method of manufacturing a semiconductor device designed with the above-described semiconductor device designing method and semiconductor device designing apparatus according to a seventh embodiment of the present invention.

FIGS. 18A through 18D and FIGS. 19A and 19B are diagrams showing the semiconductor device manufacturing method according to the seventh embodiment, following its procedure. In these drawings, the same elements as those described above are referred to by the same reference numerals, and a description thereof may be omitted.

Figure 18A:
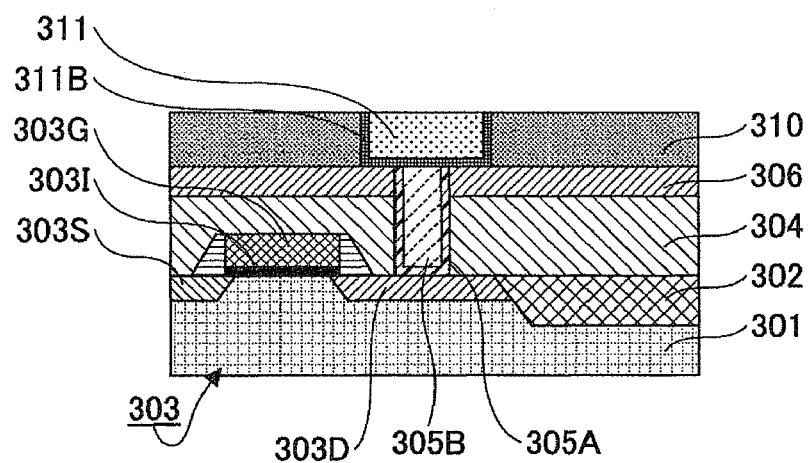
FIGS. 18A through 18D are diagrams showing a method of manufacturing a semiconductor device according to a seventh embodiment of the present invention.

First, in the process shown in FIG. 18A, the following structure including a MOS transistor 303 is formed, using known methods, on a substrate 301 formed of a semiconductor such as Si.

The MOS transistor 303 is formed in an active region (device formation region) defined by an isolation insulating film 302 having a shallow trench isolation (STI) structure formed in the surface part of the substrate 301.

The MOS transistor 303 is configured to have a gate electrode 303G formed on a gate insulating film 303I on the substrate 301, and to have a source region 303S and a drain region 303D that oppose each other across the gate insulating film 303I.

Further, a silicon oxide interlayer insulating film 304 of 300 nm in thickness and a SiOC protection film 306 of 50 nm in thickness are stacked so as to cover the MOS transistor 303. A tungsten (W) conductive plug 305B is formed in a via hole passing through the protection film 306 and the interlayer insulating film 304 so as to be connected to the drain region 303D. Further, a TiN barrier metal layer 305A of 25 nm in thickness is disposed between the conductive plug 305B and the interior surface of the via hole.

Further, an interlayer insulating film 310 of a low-dielectric-constant insulating material is formed on the protection film 306. A groove part is formed in the interlayer insulating film 310. A Cu interconnect 311 is formed in the groove part so as to be connected to the conductive plug 305B. A barrier film 311B containing Ta for preventing diffusion of Cu is formed around the interconnect 311.

The above-described structure can be formed by known methods such as photolithography, etching, chemical vapor deposition (CVD), and chemical mechanical polish (CMP).

Figure 18B:
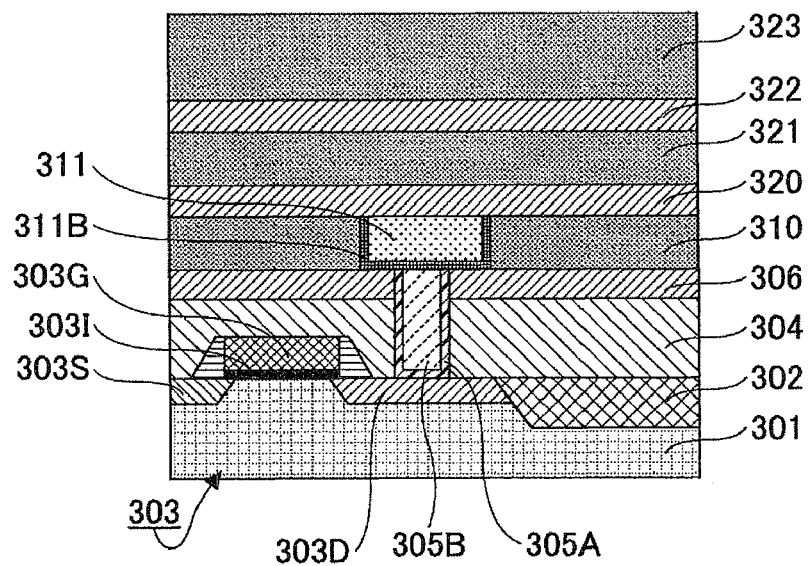

Next, in the process shown in FIG. 18B, a hard mask film 320, an interlayer insulating film 321, an etching stopper film 322, and an interlayer insulating film 323 are stacked in order on the interlayer insulating film 310.

The hard mask film 320 is a kind of silicon compound layer, for example, a silicon oxide (SiO) film, a silicon carbide (SiC) film, or a silicon nitride (SiN) film, and has a thickness of 20 to 70 nm. The hard mask film 320 may have a two-layer structure. The etching stopper film 322 is formed of, for example, SiC or silicon nitride (SiN), and has a thickness of 20 to 70 nm. These films can be formed by CVD.

Each of the interlayer insulating films 321 and 323 is formed of an organic or inorganic low-dielectric-constant insulating material, and has a thickness of 300 to 700 nm. Examples of inorganic low-dielectric-constant insulating materials include porous silica and SiOC. As an organic low-dielectric-constant insulating material, for example, SiLK (registered trade mark) manufactured by The Dow Chemical Company may be used. These materials include Si and O as component elements.

Figure 18C:
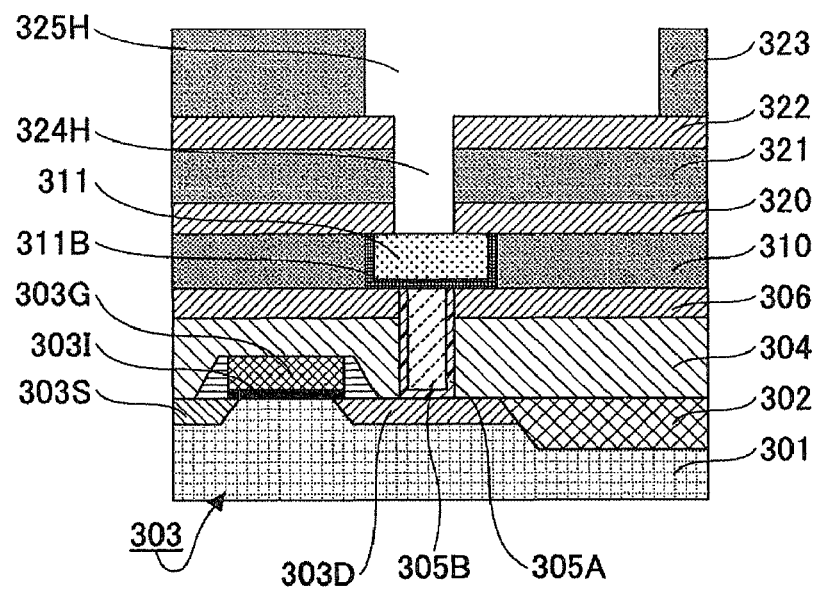

Next, in the process shown in FIG. 18C, a via hole 324H and a groove part 325H are formed in the interlayer insulating film 321 and the interlayer insulating film 323, respectively, by, for example, pattern etching using a mask pattern formed using photolithography. In this case, either one of the via holes 324H and the groove part 325H may be formed first.

The dimension of the plane cross section (width) of the via hole 324H is, for example, 0.06 to 0.1 μm, and the minimum width of the groove part 325H is, for example, 0.06 μm. The via hole 324H and the groove part 325H can be formed by dry etching using a CF-based etching gas with a film containing two layers of, for example, a SiO film and a SiC film serving as a hard mask. Further, the groove part 325H reaches the upper surface of the etching stopper film 322, and the via hole 324H reaches the upper surface of the interconnect 311.

In the semiconductor device manufacturing method according to this embodiment, in the case of forming the groove part 325H by performing pattern etching on the interlayer insulating film 323 in this process, a structure that stands up from the bottom of the groove part 325H is formed together with the groove part 325H by the pattern etching.

Figure 19A:
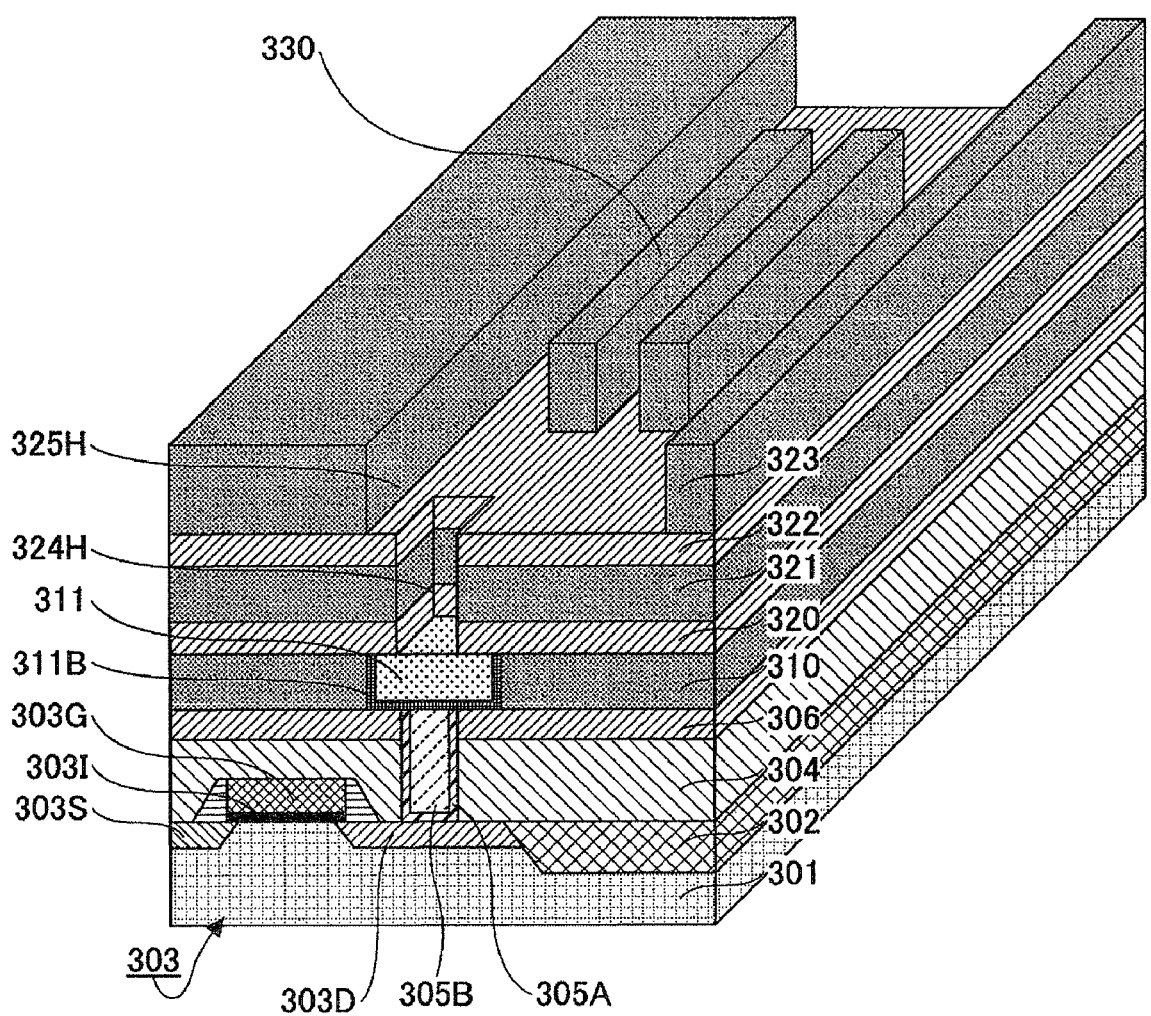
FIGS. 19A and 19B are diagrams showing the method of manufacturing a semiconductor device according to the seventh embodiment of the present invention.

FIG. 19A is a perspective cross-sectional view of the structure of this process (FIG. 18C).

FIG. 19A shows that multiple structures 330 are formed by pattern etching so as to stand up from the bottom of the groove part 325H. For example, the structures 330 are formed so as to be like slits in a plan view. The structures 330 are formed parallel to each other so as to extend parallel to a direction in which the groove part 325H extends.

Figure 18D:
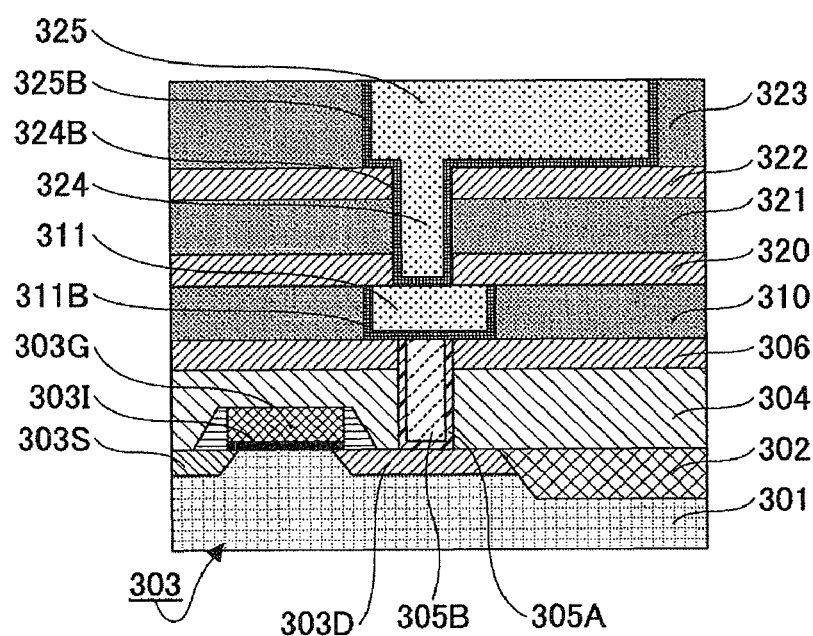

Next, in the process shown in FIG. 18D, a barrier film 324B and a barrier film 325B, each containing Ta, are formed on the inner wall surfaces of the via hole 324H and the groove part 325H, respectively, by, for example, CVD or sputtering. In this case, a barrier film is also formed around the structures 330.

Further, a seed layer to serve as a feed layer of electroplating is formed on the inner wall surface of each of the via hole 324H and the groove part 325H by, for example, sputtering or CVD. Next, the via hole 324H and the groove part 325H are filled with a conductive material (such as Cu) by electroplating using the above-described seed layer as a feed layer. The conductive material, for example, Cu in this case, embedded by the electroplating is, for example, 1 μm in thickness. As a result, a Cu via plug 324 and a Cu interconnect 325 are formed in the via hole 324H and the groove part 325H, respectively, and the conductive material (Cu) is deposited on the interlayer insulating film 323.

After the above-described Cu electroplating, the substrate 301 (Cu) is subjected to annealing for approximately 5 minutes in, for example, a nitrogen atmosphere, being heated to 300 to 400° C. After the annealing, excessive Cu deposited on the interlayer insulating film 323 is removed by CMP polishing, so that the structure shown in FIG. 18D can be formed.

Figure 19B:
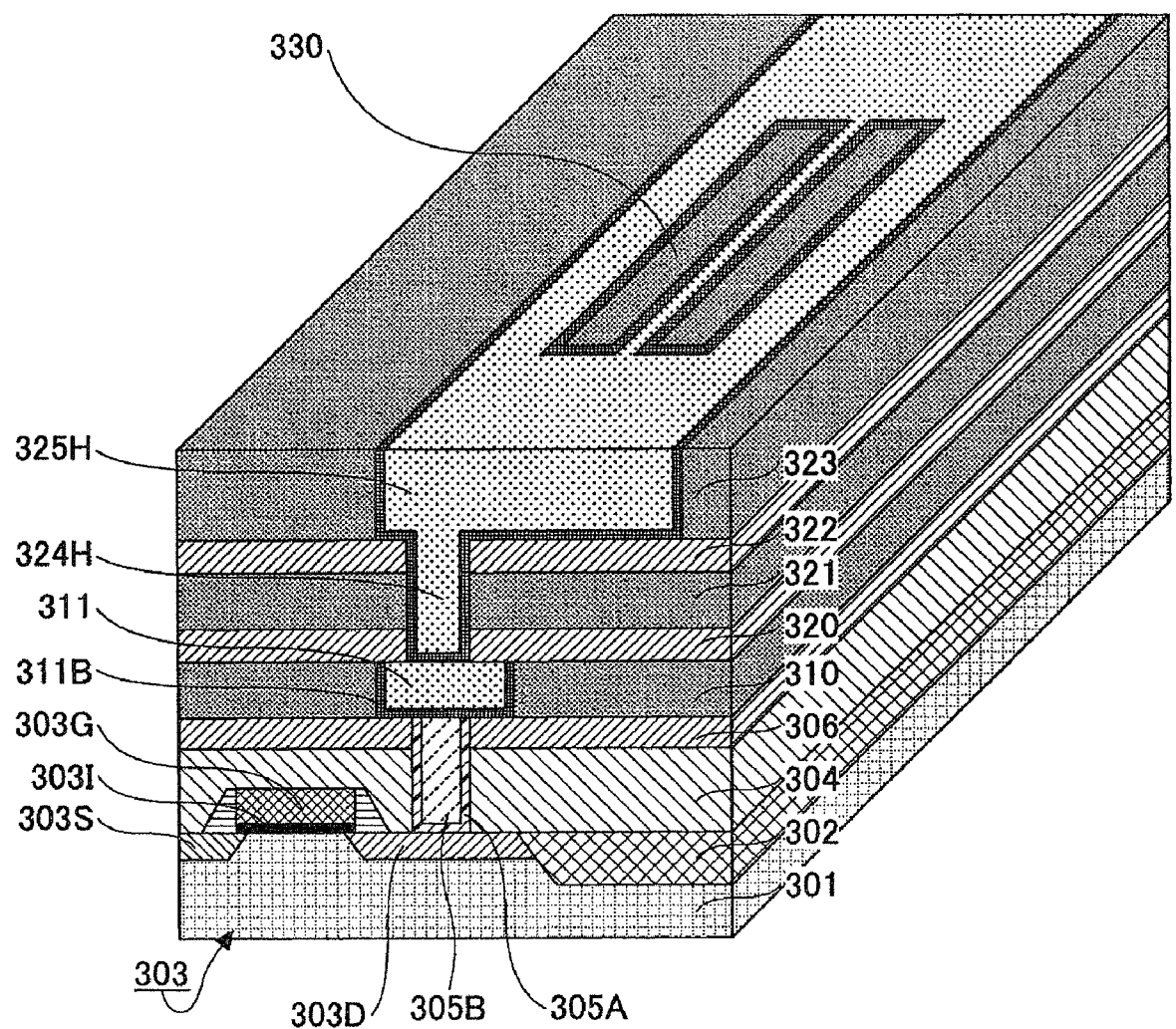

FIG. 19B is a perspective cross-sectional view of the structure of this process (FIG. 18D).

FIG. 19B shows that the structures 330 are embedded in the interconnect 325 and that multiple openings (holes) (filled with the structures 330) are formed in the interconnect 325.

In the above-described structure, a predetermined region (part) of the interconnect 325 is divided into multiple (for example, three) portions by the structures 330. The interconnect 325 has a substantial width of 1 μm in the divided region (part). Accordingly, each divided (divisional) portion of the interconnect 325 has a width of 0.33 μm. Since each of the structures 330 has a width of 0.2 μm, the total width of the interconnect 325 and the structures 330 is 1.4 μm.

Further, one or more multilayer interconnections may be formed by a known method as required so as to increase the number of layers of multilayer interconnections. Thus, a semiconductor device according to this embodiment can be manufactured.

In the above-described semiconductor device manufacturing method, Cu crystal grains grow in the heat treatment (annealing) process after plating. In the above-described case, however, since the structures 330 are further formed in the narrow groove part 325H, the growth of the crystal grains is hindered by region restriction. Accordingly, the Cu crystal becomes small in grain size, and there is greater electron scattering. Likewise, electron scattering increases in surface scattering because of an increase in the scattering probability in horizontal directions.

That is, by forming the structures 330, it is possible to control (for example, increase) the resistivity of the interconnect 325 using the size effect described above with reference to FIG. 4. That is, it is possible to control interconnect delay and skew by controlling the resistivity of an interconnect with the above-described manufacturing method.

That is, according to the above-described manufacturing method, it is possible to obtain a desired interconnect resistance (interconnect delay) by increasing the resistivity of an interconnect while maintaining the cross-sectional area of the interconnect substantially at a predetermined value. Accordingly, it is possible to easily manufacture a high-performance semiconductor device having desired characteristics without causing a substantial decrease in the electromigration tolerance of the interconnect (without substantially impairing the reliability of the interconnect).

The grain size of a conductive material forming the interconnect as described above can also be controlled by controlling impurity density or defects or by controlling annealing temperature in the manufacturing process. In practice, however, it is difficult to set different impurity density or annealing conditions for each particular interconnect in a wafer or chip.

On the other hand, according to the above-described manufacturing method, it is possible to easily apply the above-described control of resistivity to a particular interconnect at a desired position in a wafer or chip. Therefore, it is possible to adjust or control resistivity, interconnect delay, and skew flexibly in accordance with designed interconnect length and width and further with variations in interconnect height and width resulting from manufacturing problems.

According to one aspect of the present invention, there is provided a semiconductor device including multiple logic circuit cells having respective logic circuits formed therein; and multiple interconnects connected to the corresponding logic circuit cells, wherein at least one of the interconnects has an opening formed therein so as to have an opening ratio different from one or more of opening ratios of the remaining interconnects.

Accordingly, it is possible to provide a high-performance semiconductor device that has high interconnect reliability and is capable of operating at high speed.

According to one aspect of the present invention, there is provided a method of manufacturing a semiconductor device including the steps of (a) forming a groove part, in which an interconnect to be connected to a semiconductor element is to be formed, and a structure standing up from a bottom of the groove part by performing pattern etching on an insulating film; and (b) forming the interconnect by filling the groove part with a conductive material.

Accordingly, it is possible to manufacture a high-performance semiconductor device that has high interconnect reliability and is capable of operating at high speed.

According to one aspect of the present invention, there is provided an apparatus for designing a semiconductor device, including a logic design part including a cell combining part configured to design individual logic circuit cells forming the semiconductor device and a cell placement design part configured to design placement of the logic circuit cells; an interconnect design part configured to design interconnects connecting the logic circuit cells; and an opening ratio selection part configured to determine, with respect to at least one of the interconnects, an opening ratio of an opening to be formed in the at least one of the interconnects in accordance with a length of the at least one of the interconnects.

Accordingly, it is possible to provide a high-performance semiconductor device that has high interconnect reliability and is capable of operating at high speed.

According to one aspect of the present invention, there is provided a method of designing a semiconductor device, including the steps of (a) combining and placing individual logic circuit cells forming the semiconductor device; (b) designing interconnects connecting the logic circuit cells; and (c) determining, with respect to at least one of the interconnects, an opening ratio of an opening to be formed in the at least one of the interconnects in accordance with a length of the at least one of the interconnects.

Accordingly, it is possible to design a high-performance semiconductor device that has high interconnect reliability and is capable of operating at high speed.

The present invention is not limited to the specifically disclosed embodiments, and variations and modifications may be made without departing from the scope of the present invention.

For example, the interconnect to which the present invention is applied is not limited to the clock signal distribution line for distributing a clock signal. The present invention may also be applied to, for example, control of the interconnect delay (phase) of a signal line for transferring predetermined data.

For example, according to one embodiment of the present invention, it is possible to provide a high-performance semiconductor device that has high interconnect reliability and is capable of operating at high speed.

What is claimed is:

1. A method of manufacturing a semiconductor device, comprising:
    forming a groove part, in which an interconnect to be connected to a semiconductor element is to be formed, and an insulating structure standing up from a bottom of the groove part; and
    forming the interconnect by filling the groove part with a conductive material so as to surround the insulating structure with the conductive material.

2. The method as claimed in claim 1, wherein said forming the interconnect includes filling the groove part by plating.

3. The method as claimed in claim 1, wherein the structure is formed so as to divide a predetermined region of the interconnect into a plurality of portions.

4. The method as claimed in claim 1, wherein the interconnect is a clock signal distribution line for distributing a clock signal.

* * * * *